(12) United States Patent
Lenef et al.

(10) Patent No.: US 10,488,566 B2
(45) Date of Patent: Nov. 26, 2019

(54) CERAMIC WAVELENGTH CONVERTER HAVING A HIGH REFLECTIVITY REFLECTOR

(71) Applicant: OSRAM SYLVANIA Inc., Danvers, MA (US)

(72) Inventors: Alan Lenef, Belmont, MA (US); James Avallon, Beverly, MA (US); Adam Scotch, Amesbury, MA (US)

(73) Assignee: OSRAM SYLVANIA Inc., Wilmington, MA (US)

( * ) Notice: Subject to any disclaimer, the term of this patent is extended or adjusted under 35 U.S.C. 154(b) by 0 days.

(21) Appl. No.: 15/112,487

(22) PCT Filed: Jan. 26, 2015

(86) PCT No.: PCT/US2015/012838
§ 371 (c)(1),
(2) Date: Jul. 19, 2016

(87) PCT Pub. No.: WO2015/112946
PCT Pub. Date: Jul. 30, 2015

(65) Prior Publication Data
US 2016/0334552 A1   Nov. 17, 2016

Related U.S. Application Data

(60) Provisional application No. 61/931,893, filed on Jan. 27, 2014.

(51) Int. Cl.
*G02B 5/08* (2006.01)
*H01L 33/50* (2010.01)
(Continued)

(52) U.S. Cl.
CPC .......... *G02B 5/0858* (2013.01); *C04B 37/026* (2013.01); *C09K 11/0883* (2013.01);
(Continued)

(58) Field of Classification Search
CPC ..... H01L 33/50; H01L 33/501; H01L 33/502; H01L 33/505; H01L 33/507;
(Continued)

(56) References Cited

U.S. PATENT DOCUMENTS

| 7,497,581 B2 | 3/2009 | Beeson et al. |
| 7,554,258 B2 | 6/2009 | Rossner et al. |

(Continued)

FOREIGN PATENT DOCUMENTS

| WO | 2007063460 A1 | 6/2007 |
| WO | 2009074919 A1 | 6/2009 |

(Continued)

OTHER PUBLICATIONS

Kim, et al., "Surface-Plasmon-Induced Light Absorption on a Rough Silver Surface", Applied Physics Letters 98, American Institute of Physics 2011, pp. 011109-1-011109-3 (3 pages, color).

(Continued)

*Primary Examiner* — Kimberly N. Kakalec
(74) *Attorney, Agent, or Firm* — Robert F. Clark; Shaun P. Montana

(57) ABSTRACT

There is herein described a ceramic wavelength converter having a high reflectivity reflector. The ceramic wavelength converter is capable of converting a primary light into a secondary light and the reflector comprises a reflective metal layer and a dielectric buffer layer between the ceramic wavelength converter and the reflective metal layer. The buffer layer is non-absorbing with respect to the secondary light and has an index of refraction that is less than an index of refraction of the ceramic wavelength converter. Preferably the reflectivity of the reflector is at least 80%, more preferably at least 85% and even more preferably at least 95% with respect to the secondary light emitted by the converter.

24 Claims, 23 Drawing Sheets

(51) Int. Cl.
  *H01L 33/60*     (2010.01)
  *G02B 7/18*      (2006.01)
  *C09K 11/77*     (2006.01)
  *C09K 11/08*     (2006.01)
  *C04B 37/02*     (2006.01)

(52) U.S. Cl.
  CPC ...... *C09K 11/7734* (2013.01); *C09K 11/7774* (2013.01); *G02B 7/1815* (2013.01); *H01L 33/505* (2013.01); *H01L 33/60* (2013.01); *C04B 2237/062* (2013.01); *C04B 2237/121* (2013.01); *C04B 2237/125* (2013.01); *C04B 2237/343* (2013.01); *C04B 2237/407* (2013.01); *C04B 2237/708* (2013.01); *C04B 2237/72* (2013.01)

(58) Field of Classification Search
  CPC ..... H01L 33/508; H01L 33/504; H01L 33/60; G02B 5/0816; G02B 5/0825; G02B 5/0858; G02B 7/1815; C09K 11/0883; C09K 11/7734; C09K 11/7774; C04B 37/026; C04B 2237/121; C04B 2237/407; C04B 2237/125; C04B 2237/343; C04B 2237/062; C04B 2237/72; C04B 2237/708
  See application file for complete search history.

(56) References Cited

U.S. PATENT DOCUMENTS

| | | | |
|---|---|---|---|
| 2009/0236619 A1* | 9/2009 | Chakroborty | H01L 33/44 257/89 |
| 2010/0245777 A1 | 9/2010 | Ogura | |
| 2010/0258831 A1* | 10/2010 | Jagt | H01L 33/46 257/98 |
| 2010/0328632 A1 | 12/2010 | Kurosaki et al. | |
| 2011/0205502 A1 | 8/2011 | Kato et al. | |
| 2011/0210658 A1* | 9/2011 | Pan | B32B 18/00 313/112 |
| 2011/0309398 A1* | 12/2011 | Ito | H01L 33/505 257/98 |
| 2013/0250544 A1 | 9/2013 | Zink et al. | |
| 2015/0077973 A1* | 3/2015 | Hagemann | C09K 11/7774 362/84 |

FOREIGN PATENT DOCUMENTS

| | | |
|---|---|---|
| WO | 2011099640 A1 | 8/2011 |
| WO | 2011097137 A1 | 9/2011 |

OTHER PUBLICATIONS

Materion co. Technical Note, "Yttrium Oxide Y2O3 for Optical Coating", accessed Jun. 13, 2016 from https://materion.com/ResourceCenter/ProductData/InorganicChemicals/Oxides/YttriumOxideY2O3forOpticalCoating.aspx (3 pp.).

Thomas et al., "High Reflectivity of Silver Extended Down to 200 nm", OSA/OIC 2001, Paper TuF2-2 (3 pages, color).

Mayani, et al., "Experimental Study of the Relationships Between the Near-Normal Reflectance, the Optical Constants, and the Roughness of Thin Silver Films", J. Optical Society of America, vol. 7, No. 2, Feb. 1990 (pp. 191-195).

* cited by examiner

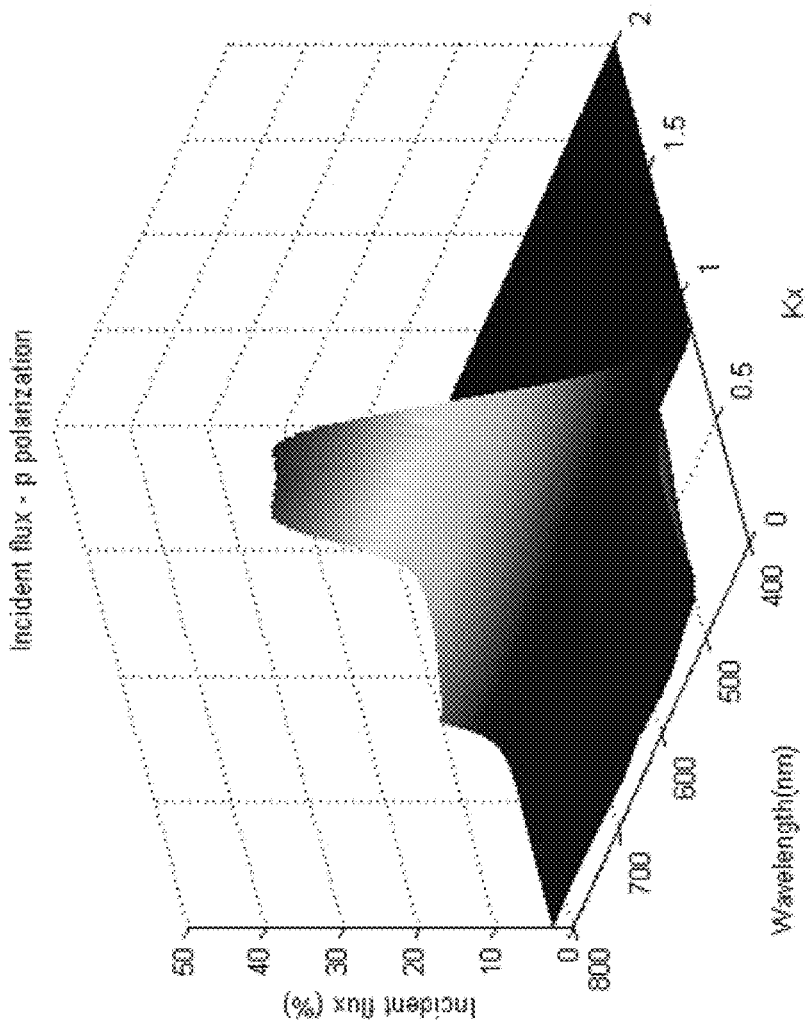
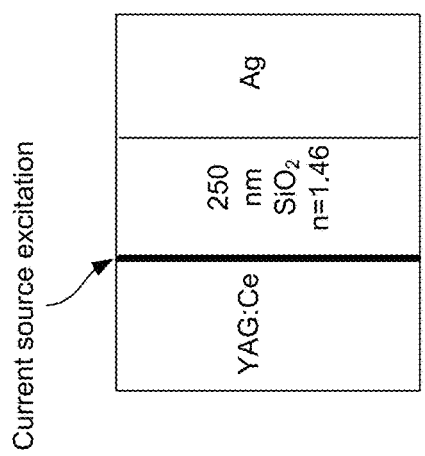
FIG. 13A
FIG. 13B

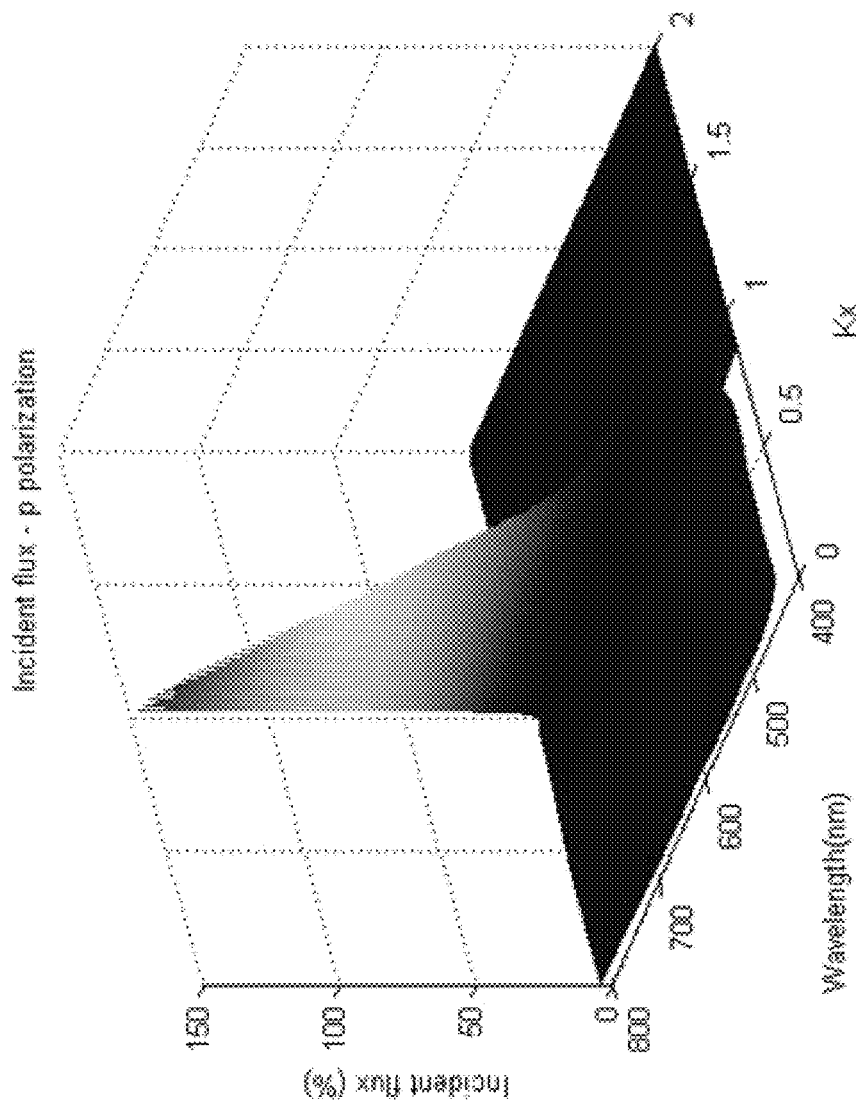
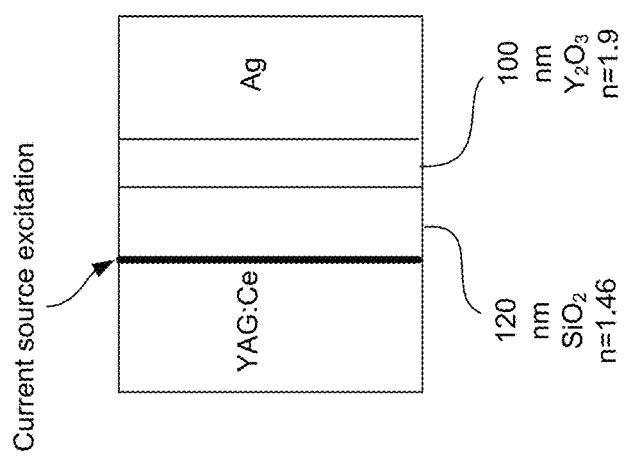
FIG. 14B
FIG. 14A

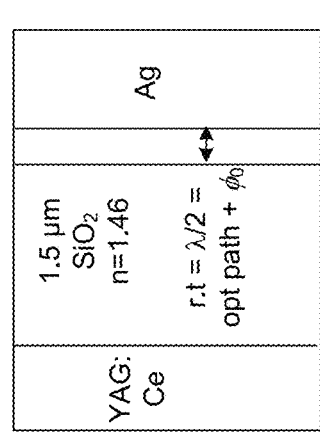
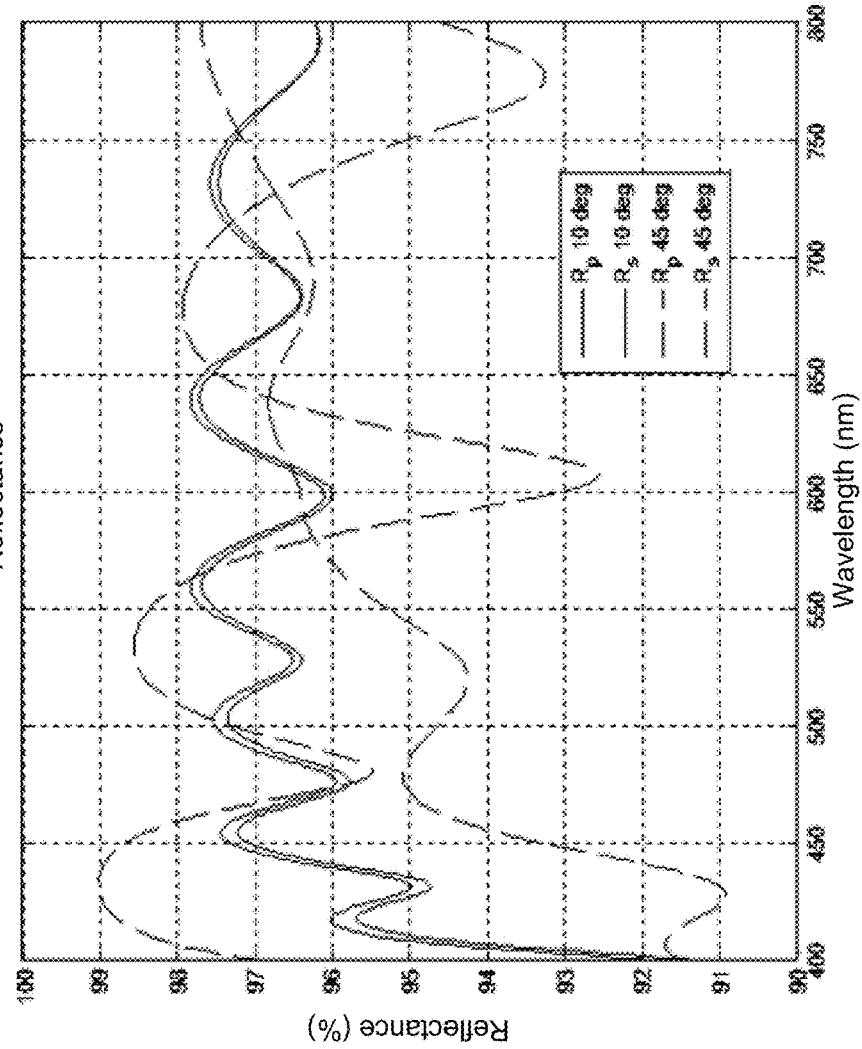
FIG. 18A
FIG. 18B

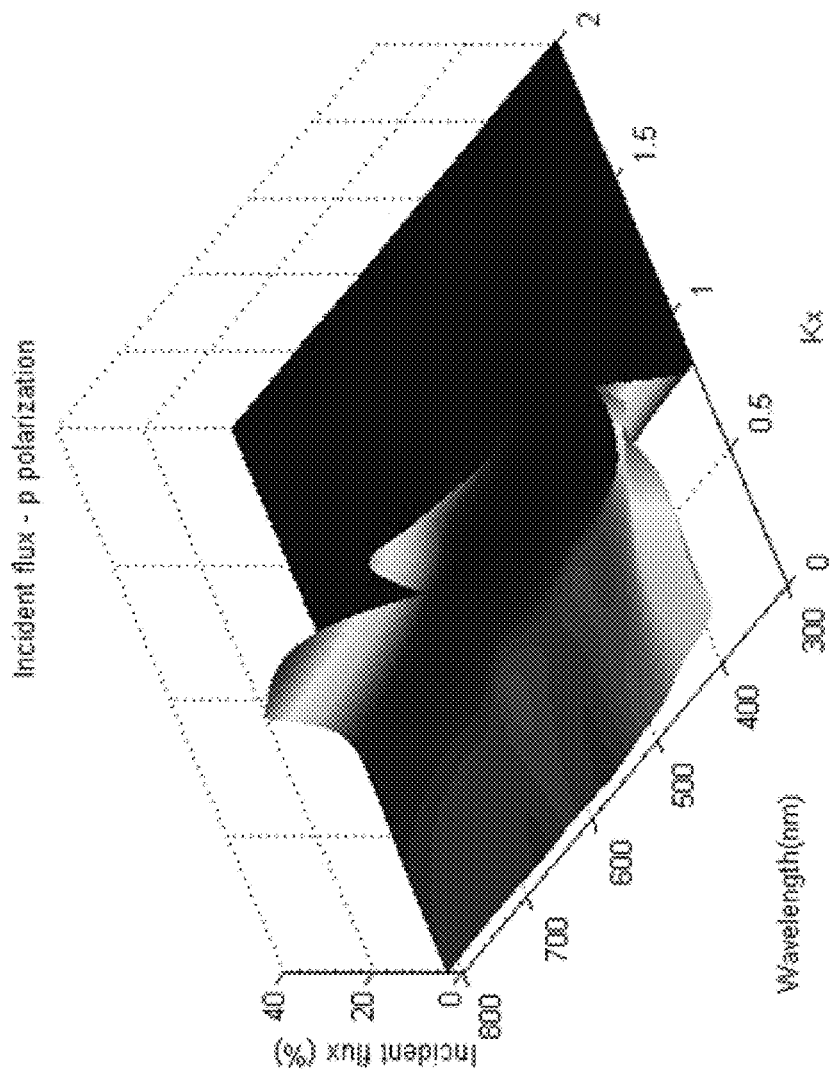
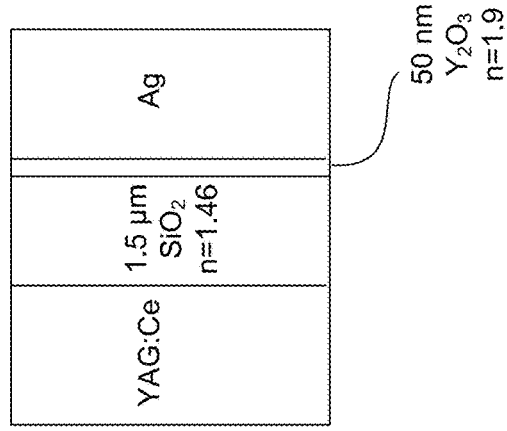
FIG. 19A
FIG. 19B

CERAMIC WAVELENGTH CONVERTER HAVING A HIGH REFLECTIVITY REFLECTOR

CROSS REFERENCES TO RELATED APPLICATIONS

This application claims the benefit of U.S. Provisional Application No. 61/931,839, filed Jan. 27, 2014.

BACKGROUND

It is well known to use phosphors to convert blue light emitted from light emitting diodes (LEDs) into longer wavelengths in order to affect the overall color of the light emitted from the LED. See, e.g., U.S. Pat. Nos. 6,613,247 and 6,653,765. One very important application for such wavelength conversion is in the generation of white light. For example, a typical white-light application involves the conversion of a portion of the blue light emitted by the LED into a yellow light by a phosphor embedded in the epoxy resin that encapsulates the LED. The combined effect of the remaining unconverted blue light and the converted yellow light is to produce an overall white light output. It is also known to use phosphor conversion to fully convert the light emitted by an LED into light having a different color, e.g., green or red. This is generally referred to as full conversion.

Another means of achieving similar results is to use a solid, sintered ceramic wavelength converter instead of phosphor powders. Such converters have at least three distinct advantages over phosphor powders. First, ceramic converters can be made in defined shapes and uniform thicknesses to provide better consistency and color control in manufacturing. Second, scattering can be adjusted to optimize extraction efficiency. And third, the solid ceramic converters generally exhibit better thermal conductivity allowing for greater power dissipation. Examples of such ceramic converters are described in U.S. Pat. No. 7,554,258, U.S. Patent Application Publication 2007/0126017 and International Patent Application Publication No. WO 2006/087660. Similar to the phosphor powders described above, the ceramic wavelength converters may be used to covert the light from a blue LED or laser diode into a yellow light in order to produce an overall white light or in a full conversion application to produce for example a green or red light.

SUMMARY OF THE INVENTION

It is an object of the invention to obviate the disadvantages of the prior art.

It is another object of the invention to provide a ceramic wavelength converter having a high reflectivity reflector.

It is a further object of the invention to provide a ceramic wavelength converter for reflective laser-activated remote phosphor (LARP) applications.

In accordance with an object of the invention, there is provided a ceramic wavelength converter having a high reflectivity reflector. The ceramic wavelength converter is capable of converting a primary light into a secondary light and the reflector comprises a reflective metal layer and a dielectric buffer layer between the ceramic wavelength converter and the reflective metal layer. The buffer layer is non-absorbing with respect to the secondary light and has an index of refraction that is less than an index of refraction of the ceramic wavelength converter. Preferably the reflectivity of the reflector is at least 80%, more preferably at least 85%, and even more preferably at least 95% with respect to the secondary light emitted by the converter.

In accordance with another object of the invention, the reflector of the ceramic wavelength converter is bonded to a heat sink with a metal-to-metal bond to provide greater heat dissipation.

In a further aspect, the reflector of the ceramic wavelength converter has a quenching layer between the buffer layer and the reflective metal layer, the quenching layer having an index of refraction that is greater than the index of refraction of the buffer layer.

BRIEF DESCRIPTION OF THE DRAWINGS

FIG. 7A shows a standard excitation with propagating plane wave and FIG. 7B shows a near-field excitation from sinusoidal current sheet 100 nm from metal-ceramic interface.

FIGS. 13A and 13B are an illustration of a configuration having a 250 nm $SiO_2$ buffer layer and a 3D plot of the calculated p-polarization absorption (net incident flux) versus wavelength and relative transverse wavevector $K_x$ in the YAG:Ce ceramic converter, respectively.

FIGS. 14A and 14B are an illustration of a configuration having a 120 nm $SiO_2$ buffer layer and a 100 nm $Y_2O_3$ quenching layer and a 3D plot of the calculated p-polarization absorption (net incident flux) versus wavelength and relative transverse wavevector $K_x$ in the YAG:Ce ceramic converter, respectively.

FIGS. 18A and 18B are an illustration of a configuration having a 1.5 μm $SiO_2$ buffer layer and a 105 nm $Y_2O_3$ quenching layer and a plot showing calculated reflectance for incident light from YAG:Ce ceramic converter at 10° and 45° with respect to normal, respectively.

FIGS. 19A and 19B illustrate the absorbed flux using a 50 nm quenching layer configuration.

DETAILED DESCRIPTION OF THE INVENTION

For a better understanding of the present invention, together with other and further objects, advantages and capabilities thereof, reference is made to the following disclosure and appended claims taken in conjunction with the above-described drawings.

As used herein, a ceramic wavelength converter refers to a solid, sintered polycrystalline photoluminescent material. Ceramic wavelength converters do not include wavelength converters comprising particles of a phosphor material dispersed in an organic or inorganic matrix.

References to the color of a phosphor, LED, laser, or conversion material refer generally to its emission color unless otherwise specified. Thus, a blue LED emits a blue light, a yellow phosphor emits a yellow light and so on.

Ceramic wavelength converters play an important role for high power, high radiance applications. This includes projection and display optics applications where light sources must have low étendue to efficiently couple into the optical system. In a preferred application, one may excite the phosphor with a laser to attain particularly high radiance. This approach is often called laser-activated remote phosphor (LARP) technology.

Figure 1:
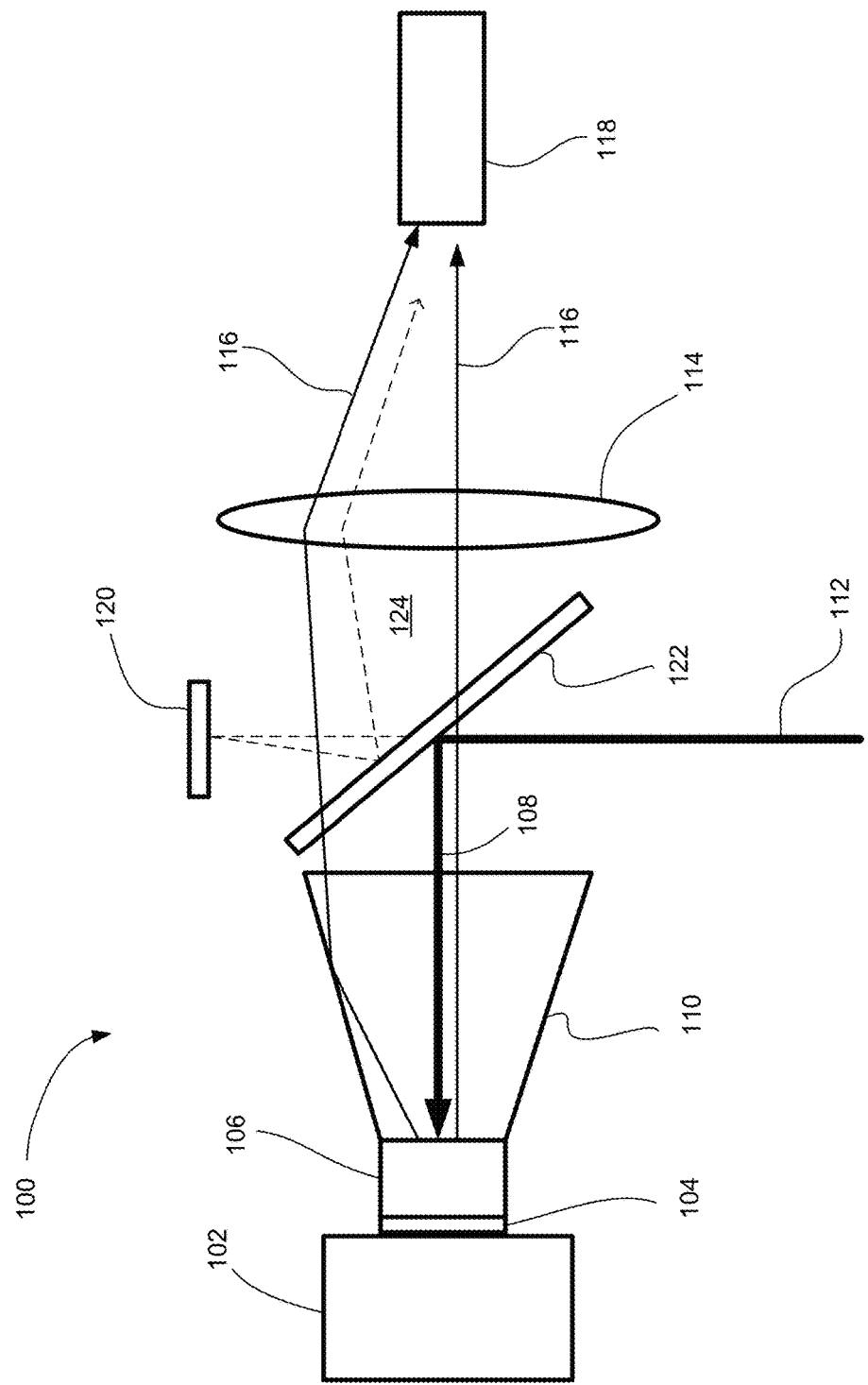
FIG. 1 is a schematic illustration of a reflective laser activated remote phosphor geometry with a ceramic wavelength converter having a high reflectivity reflector according to this invention.
Figure 2:
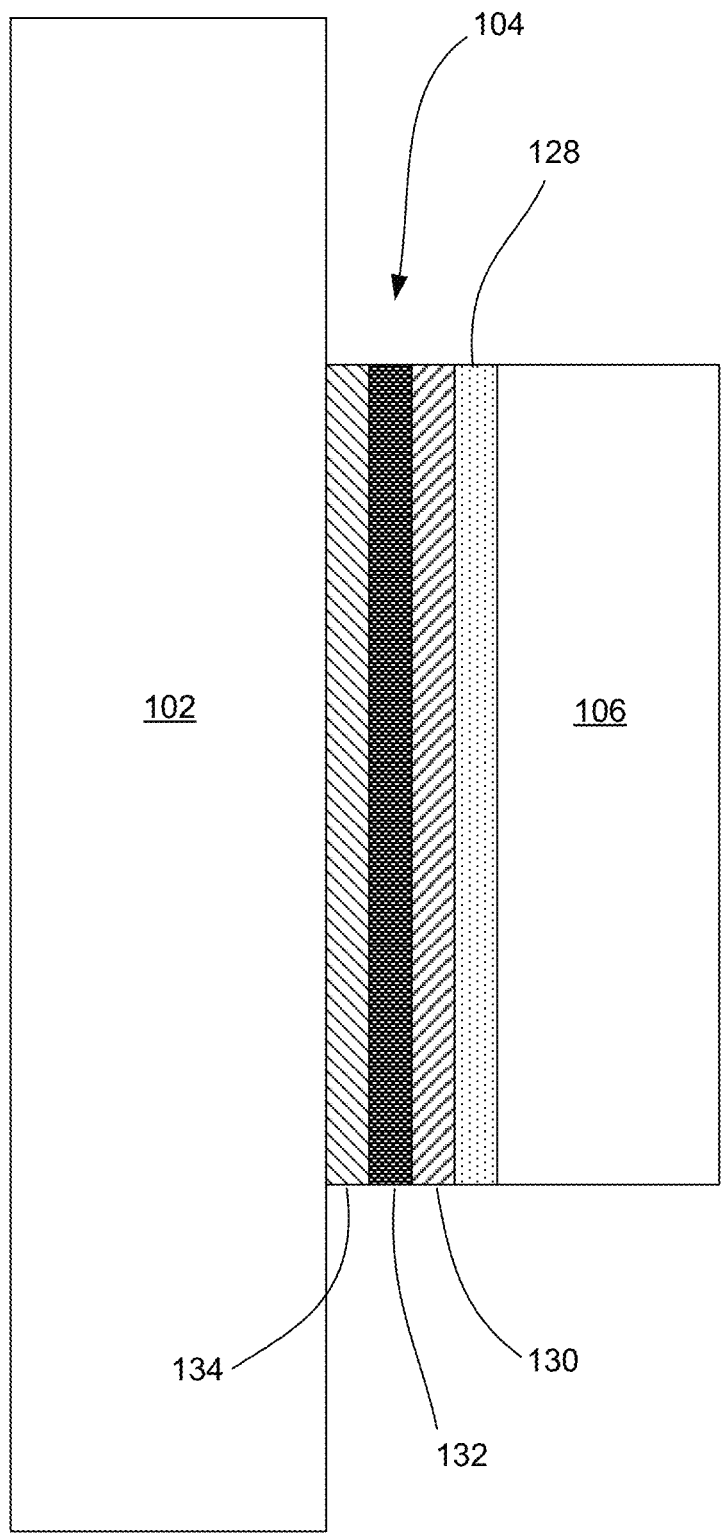
FIG. 2 is a cross sectional illustration of a ceramic wavelength converter and its high reflectivity reflector mounted to a heat sink.

One effective LARP method is a reflective approach, where the phosphor is in contact with reflective surfaces so that backward-directed luminescent light is returned back through the phosphor in the direction of the laser source. An optical configuration that takes advantage of the reflective LARP approach 100 is shown in FIG. 1 which employs a ceramic wavelength converter having a high reflectivity reflector according to this invention (e.g., as shown in FIG. 2.) Here, laser light 112 is reflected off a dichroic beam splitter 122 and a first portion 108 is directed towards the ceramic wavelength converter 106 through a collimating optic 110. A total-internal reflection (TIR) optic 110 is shown as an example, but this could be a low F/# aspheric lens or other optic. Ceramic wavelength converter 106 is bonded to reflector 104 which is in turn bonded to heat sink 102. The laser light portion 108 excites the phosphor of the ceramic converter 106 to photoluminescence which is then collected by collimating optic 110. This converted radiation 116 is directed back towards the dichroic beam splitter 122 which now passes the converted radiation into the light channel 124. Note that additional color channels 120 can be added in this scheme. This includes adding a portion of the laser (pump) light into the light channel by allowing partial transmission of pump light through the dichroic and scattering or reflecting the pump light, rather than adding an additional phosphor element. Focusing lens 114 collects the light in light channel 124 and focuses it onto fiber/projection optics 118. The scheme can be extended to include more than two color channels with additional dichroic beam splitters and combiners.

Critical to this reflective approach is that the portion of the luminescence that goes in the backward direction must be efficiently reflected back towards the collection optic 110. In order to have effective recycling, the reflective surfaces must have very high reflectance, and losses in the ceramic converter at recycling wavelengths must be low. Furthermore, the low étendue required for projection and display optics applications requires that the incident laser light has a high intensity. This can lead to excessive heating of the phosphor and limit achievable power levels and degradation. The heating of the phosphor is caused by the Stokes shift of the phosphor, non-radiative losses in the phosphor (non-unity quantum efficiency), and losses in the bulk and the reflective surfaces. Unless this heat is effectively dissipated, it will increase the temperature of the phosphor and thereby quench its emission. Thus, for high efficiency conversion in the reflective LARP approach, one must simultaneously have very high reflectance surfaces and highly effective heat transfer.

To help mitigate the heating of the phosphor, ceramic wavelength converters are highly beneficial because they have much higher heat conductivity than typical approaches that use powdered phosphors embedded in organic or inorganic matrices. Furthermore, scattering in the ceramic can be tuned to help confine the emission spot and lessen the reflectivity requirements of the reflective surfaces. Thus, the use of ceramics for LARP or other high power, high radiance remote phosphor applications has important advantages.

The present invention is a ceramic reflective remote phosphor design that has considerably improved performance over previous reflective remote phosphor approaches, including ceramic wavelength converters which are glued to highly reflective substrates with thermally-enhanced (translucent) glues. In particular, the present invention can operate at much higher incident pump intensities and powers before phosphor quenching occurs or the supporting materials overheat. The invention makes use of the high thermal conductivity of ceramic wavelength converters while employing a special dielectric-metalized coating structure that can be bonded to a metal heatsink for excellent thermal dissipation. The use of a metal reflector such as Ag or Al, combined with dielectrics, maintains high reflectivity at all angles. The resulting structure is then bonded to a high thermal conductivity substrate using standard soldering or low-temperature sintering methods.

One of the more difficult problems associated with metal coatings on materials such as luminescent ceramics is that several factors can severely degrade coating reflectance. One of the most important issues is that unpolished ceramics have surface roughness values that can exceed ±0.5 µm, depending on grain size. When applying Ag or Al films to such surfaces, multiple reflection losses and excitation of plasmon resonances lead to very large net reductions in reflectance. Similar issues occur from the scattering centers (pores or second phases) which are in sub-wavelength proximity of the metal surface. Finally, even emission from the activator ions which are in sub-wavelength proximity of the metal surface, can excite surface plasmon polaritons (SPPs). This again leads to additional losses. The present invention provides a way to mitigate these problems, even allowing one to use unpolished ceramics which can reduce processing costs.

The present invention may provide the following advantages:

a) By using a metalized coating of high reflectivity, one can solder or sinter the ceramic directly to a metal heatsink, ensuring high heat transfer. Thus one can apply very high laser light pump intensities and pump powers without thermal quenching or cracking because of the lower ceramic temperatures. The incident fluxes achievable are greater than with using organic bonding or glass bonding approaches.

b) The ceramic wavelength converter has high thermal conductivity, reducing thermal saturation of the phosphor thereby permitting operation at higher radiances in a static configuration. This eliminates costly components such color wheels, motor control circuits, and other associated components. The use of ceramic converters permits good control over activator doping levels, scattering, and geometry, providing a high degree of engineering freedom and manufacturing control.

c) The use of high-scattering ceramics provides high backscattering, high incident laser absorption, lower activator concentration for increased quantum efficiency and better thermal quenching behavior, well-confined emission spots, and enhanced extraction, especially compared to single crystal phosphors.

d) The present invention helps mitigate two primary problems associated with fabricating high-reflectivity coatings metal coatings on ceramics. Normally excitation of surface plasmon polariton (SPPs) modes in the metal reflector caused by surface roughness, emission from luminescent centers less than one wavelength away, and scattering centers less than one-wavelength away, all lead to additional losses. This reduces the reflectivity and therefore the conversion efficiency of the ceramic converter. The second problem is the enhancement of losses that occur from multiple scattering within rough, low, but finite loss reflective optical materials such Ag or Al. With the present invention, these effects have reduced impact on reflectivity, thereby allowing for net conversion efficiencies that approach those of uncoated ceramics.

e) The present invention is applicable to any area requiring the use of second surface highly reflective coatings for ceramics. This includes high power LED excitation, ceramic aperture lamps using LED excitation, and other applications.

An embodiment of the present invention is shown in FIG. 2 which illustrates one example of a preferred construction of reflector 104 and construction of the complete remote phosphor target including ceramic wavelength converter 106. A buffer layer 128 on the order of at least 1-2 wavelengths in thickness separates the reflective metal layer 130 (e.g., a Ag or Al coating) and the ceramic converter 106. Additional dielectrics layers may be employed to further improve reflectivity. Adhesion layers may also be required to bond the reflective metal to the dielectrics. For the sake of brevity, the whole system of buffer layer, reflectivity enhancing dielectrics, adhesion layer(s), and reflective metal layer will be collectively and generally termed the "reflector," but this is not intended as a limitation on the invention which may comprise more or fewer layers to achieve the desired reflectivity. On the other side of the reflective metal layer 130 is metal bonding layer 132 which comprises other metals known in the art that provide good adhesion to the reflective metal, isolation of the reflective metal from the bonding process, and provide good bonding with bonding materials. Bonding materials may include but are not limited to solder, nano-silver in organic binders (low-temperature Ag sintering), and Ag-filled epoxy or other high-temperature organic adhesives (if temperatures are appropriate). Preferably, a metal-metal bond 134 is formed between the metal bonding layer 132 and the metal heat sink 102.

Figure 3:
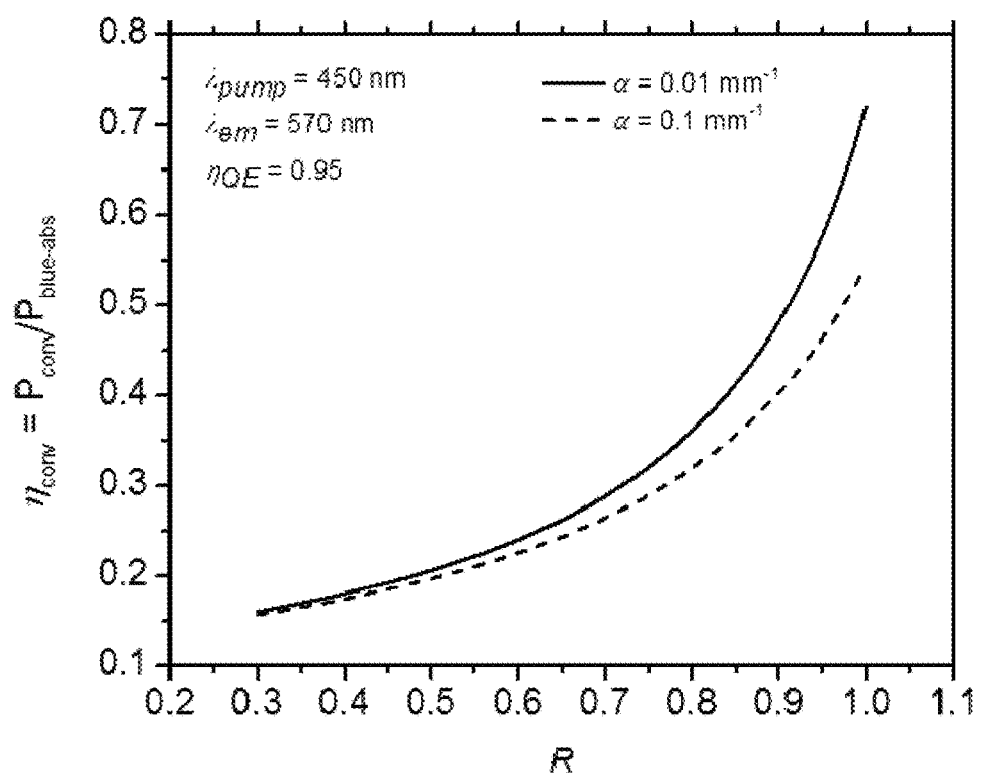
FIG. 3 is a plot of calculated net conversion efficiency for 1 mm×1 mm×0.1 mm phosphor volume with reflective surfaces on back and sides.

To understand the different components in the invention, it is important to understand the reflectivity requirements for the reflector. In order to achieve high conversion efficiency, the reflectivity of the reflector should be at least 80%, preferably at least 85%, with 95% or more being most desirable. In this way radiation initially emitted away from the desired forward direction can be recycled effectively. FIG. 3 shows a calculation of the net conversion efficiency of a hypothetical 1.0 mm×1.0 mm×0.1 mm ceramic wavelength converter in the form of a flat platelet that is bounded by reflective layers of reflectance R on five of its six surfaces. The emitted light comes from the top surface. In this example, calculated by a photon rate equation approximation, the ceramic wavelength converter is assumed to have an internal quantum efficiency (QE) of $\eta_{QE}=0.95$, an incident pump wavelength of $\lambda_{pump}=450$ nm and an emission wavelength $\lambda_{em}=570$ nm. At R=1.0, the conversion efficiency $\eta_{conv}$ is nearly equal to the product of internal QE and net conversion fraction after Stokes loss. For this example, $\eta_{conv}=\eta_{QE}\times\eta_{Stokes}=0.75$, where $\eta_{Stokes}=\lambda_{pump}/\lambda_{em}$. Since the calculation includes the effect of small added volume absorptivities (1/mm), denoted by $\alpha$, the conversion efficiency at R=1.0 for even $\alpha=0.01$ mm$^{-1}$ is slightly below the theoretical value of 0.75. Ceramics converters have very low internal losses and are therefore well suited for such applications. The larger volume loss value $\alpha=0.1$ mm$^{-1}$ shows, for example, the possible effect of activator ion self-absorption losses on the blue side of the emission spectrum; here one can see that even a 1% self-absorption loss across the 0.1 mm thickness of the ceramic converter can lead to significant losses at those wavelengths. However, this does not take into account the possible effect of re-emission by the self-absorbed photons. Implicit in these calculations is that scattering within the ceramic and/or interfaces is strong enough such that the radiation is isotropic. In practice, scattering must be present to provide light extraction; if no scattering is present, light is eventually absorbed through very large numbers of multiple total-internal reflection (TIR) bounces.

The ceramic wavelength converter itself can be one of many photoluminescent materials, including cerium-activated garnets having the general formula $(Y,Lu,Gd)_3Al_5O_{12}$:Ce, for example, $Y_3Al_5O_{12}$:Ce (YAG:Ce), $Lu_3Al_5O_{12}$:Ce (LuAG:Ce) and $(Y,Gd)_3Al_5O_{12}$:Ce (YGdAG:Ce) as well as europium-activated oxynitrides having the general formula $(Ba,Ca,Sr)Si_2O_2N_2$:Eu, for example $SrSi_2O_2N_2$:Eu (Sr-SiON:Eu), and many other ceramic phosphor materials known in the art. Materials are determined by desired color points, with Ce-based ceramics typically used for green or yellow converters, and Eu-based nitrides for red or amber. Preferably, the ceramic wavelength converter has the form of a flat plate. Fabrication of ceramic platelets can be accomplished by a variety of ceramic-forming methods. Typical platelet thicknesses are on the order of 100 μm, but can have considerable variation depending on specific applications. Final sintering parameters determine the scattering length in the material. Typically, platelet thickness should be at least on the order of the scattering length, and more preferably, thicker than the scattering length to achieve sufficient back-scattering and extraction of luminescent radiation. Scattering is achieved through pores that form at grain boundary intersections in the case of isotropic materials such as yttrium aluminum garnet (YAG) and/or grains themselves in the case of anisotropic materials such as most nitrides. Additionally, scattering centers can be introduced through second phases, special fillers, and other methods known in the art. Typically scattering center dimensions roughly lie in a range of 100 nm to a few microns, as this range provides the most efficient scattering for a given volume fraction of scatterers. Well below 100 nm, scattering cross-sections become small relative to their geometric cross-sections at visible wavelengths. On the other hand large scatterers can have large cross-sections but occupy considerable volume per scatterer, requiring high porosity in the ceramic to reach low enough scattering lengths. This is undesirable for good thermal conductivity, adsorption of atmospheric contaminants, and often reduces quantum efficiency. Furthermore, larger scatterers have highly forward directed scattering, making them less effective for the back-scattering desired in the reflective configuration.

Figure 4:
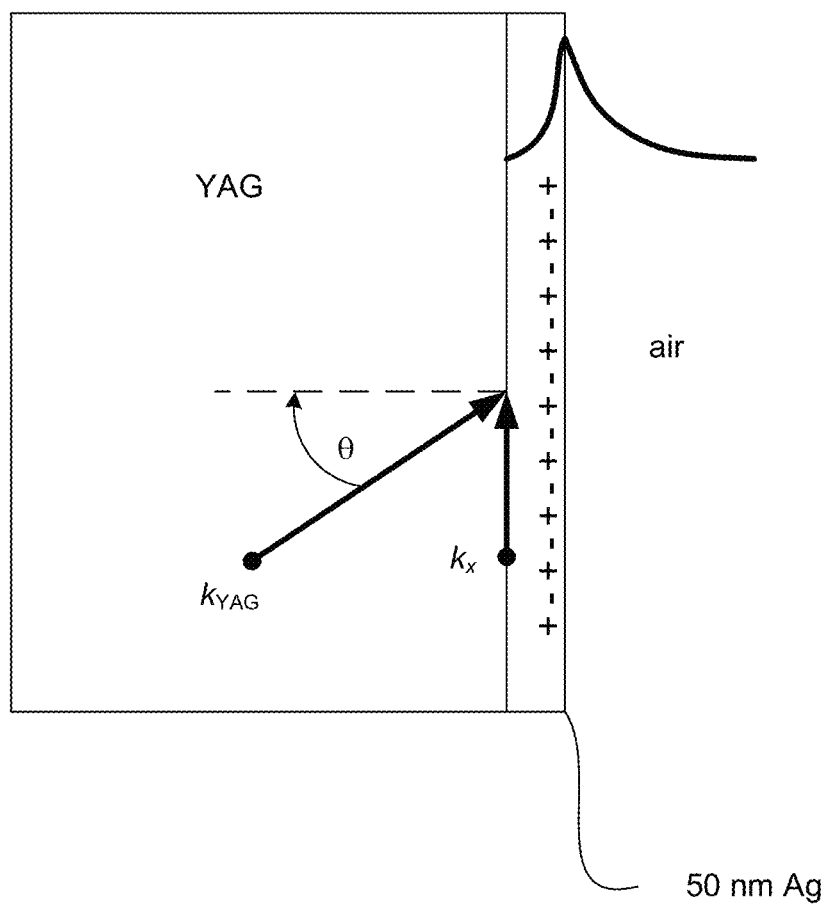
FIG. 4 is a schematic showing a Kretschmann configuration for exciting surface plasmon polariton (SPP) modes from light incident in a yttrium aluminum garnet (YAG) dielectric.

FIG. 4 shows a typical configuration for SPP excitation in which the metal coating (50 nm Ag) is thin enough to allow some transmitted light into the air side. A collimated, narrow-band light source is incident from inside the dielectric (YAG for illustration, n=1.82) at an angle θ with respect to the surface normal. The incident light source is p-polarized (electric field in the plane of incidence). This induces a sinusoidal surface charge distribution in the metal with a spatial frequency $k_x$ that matches the spatial frequency of the incoming beam, projected onto the surface. That is, $$k_x = n_m k_0 \sin\theta = k_{YAG}\sin\theta, \quad (1)$$

where $k_{ph}=2\pi/\lambda_0$ is the free-space wavevector with $\lambda_0$ being the free-space wavelength, and $n_m$ is the refractive index of the incident light medium (YAG) in FIG. 4. The wave-vector $k_x$ is the transverse projection of the incident wave-vector $k_{YAG}$.

At optical frequencies below the intrinsic plasma resonance of the metal and at small angles of incidence, charges essentially follow the exciting electric field in phase; this results in the usual reflected beam. Above the plasma resonance of the metal, the charge distribution lags the electric field, becoming out-of-phase and reduced in amplitude, resulting in transmission of light rather than reflection. For frequencies below the plasma frequency (equivalently wavelengths longer than the plasma wavelength), the refractive index of an ideal metal is negative. Plasma resonances occur at 138 nm for Ag and 70 nm for Al, but note that the actual dielectric response of these metals also depends on inter-band features in the ultraviolet. For ideal metals with a single plasmon resonance at angular frequency $\omega_p$, the relative dielectric constant $\varepsilon_m$, relative to the free-space dielectric coefficient $\varepsilon_0$, has the form:

$$\varepsilon_m = 1 - \frac{\omega_p^2}{\omega^2 + i\omega\Gamma}. \quad 2)$$

Here, $\omega=2\pi c/\lambda_0$ and $\Gamma$ is roughly the collision frequency of the electrons in the metal and leads to dissipation.

When the metal dielectric coefficient is negative in Equation (2), one can show that this produces an evanescent field in the metal, a necessary condition for a surface wave. Under certain conditions the configuration in FIG. 4 can produce SPP resonances. The SPP is a surface wave that travels along the air-metal interface. This can be shown to occur when the following condition is met:

$$k_x = k_0\sqrt{\frac{\varepsilon_d\varepsilon_m}{\varepsilon_d+\varepsilon_m}}. \quad (3)$$

Here, $\varepsilon_d$ is the dielectric constant for the non-metallic material through which the SPP propagates. Note that because transverse phase-matching must be maintained across all interfaces, the transverse wavevector $k_x$ in Equation (3) refers to both the wavevector of the SPP mode and the transverse wavevector of the incident light. In FIG. 4, the dielectric into which the SPP propagates is just air, and $\varepsilon_d=1$. Below the plasma frequency, since $\varepsilon_m<0$ for a lossless metal ($\Gamma=0$), $\varepsilon_m<-\varepsilon_d$ is required for a real valued $k_x$. Since, $\varepsilon_m$ becomes more negative with decreasing frequency in Equation (2), the SPP will occur red-shifted from the intrinsic metal plasma wavelength. Furthermore, one can see from Equation (3) that when $\varepsilon_m<0$ (as required), the transverse spatial frequency of the field, $k_x$ must be larger than the total wavevector in the dielectric medium (air in FIG. 4) in order for the SPP mode to exist. This is the reason why the configuration in FIG. 4, for example, is needed to excite the SPP modes. For a given free-space wavelength, the wavelength in the YAG medium of FIG. 4 is smaller by a factor of the index of YAG. Therefore when the angle of incidence is steep enough, the transverse wavevector $k_x$ becomes larger than the total wavevector in air which is just $k_0$. Only then can the SPP mode at the metal-air interface be excited. Note that for these results, as for any results involving multiple layers, the transverse wavevector $k_x$ is conserved among all layers because of phase-matching (continuity of EM fields).

Figure 5A:
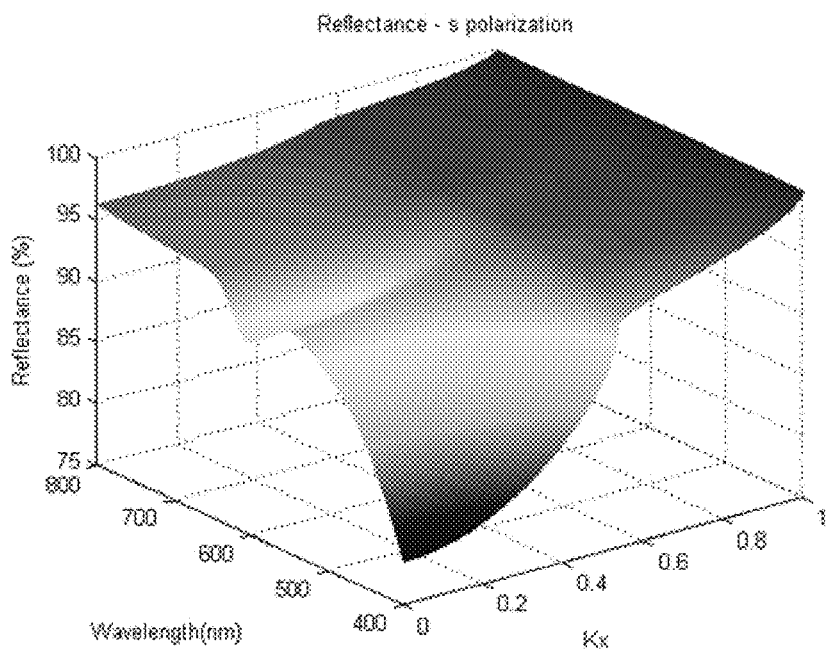
FIGS. 5A and 5B are 3D plots showing calculated reflectances for the 50 nm thick silver film in FIG. 4 as a function of relative incident transverse wavevector $K_x=k_x/k_{ph}$, where the wavevector $k_{ph}=2\pi n_{YAG}/\lambda_0$ is the wavevector in YAG. Results are shown for s- and p-polarizations, respectively.
Figure 5B:
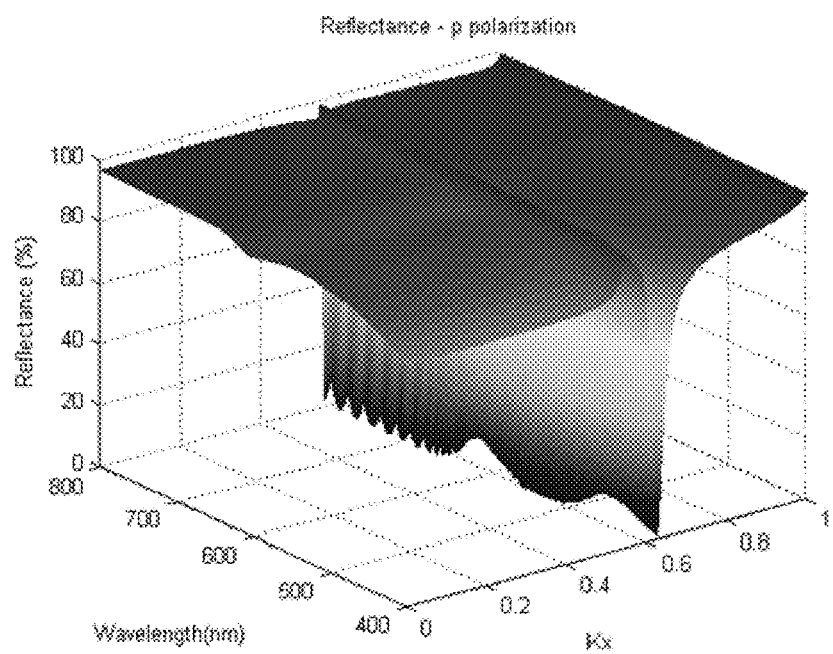
Figure 6A:
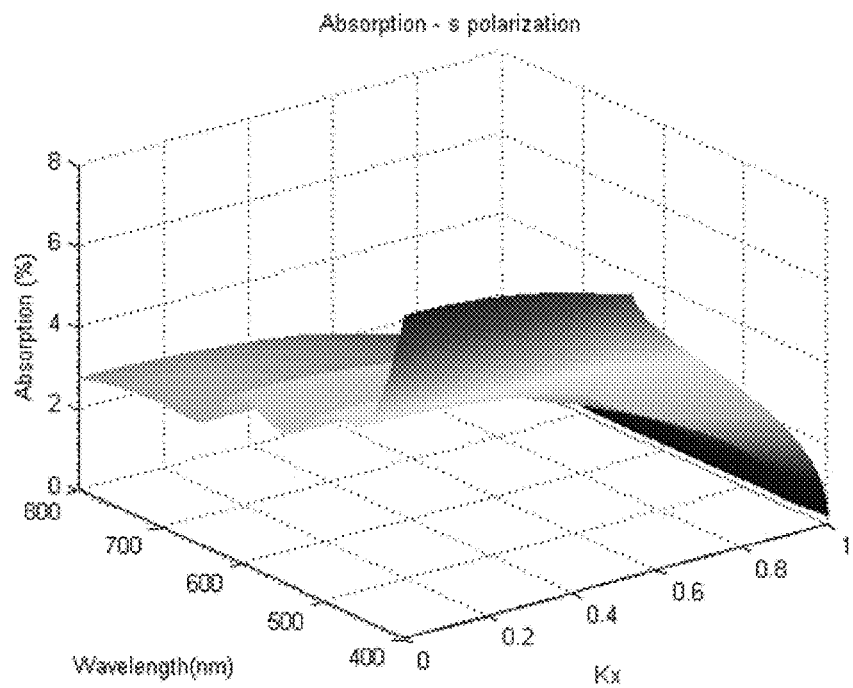
FIGS. 6A and 6B are 3D plots showing calculated absorption for the 50 nm thick silver film in FIG. 4 as a function of relative incident transverse wavevector $K_x=k_x/k_{ph}$, where the wavevector $k_{ph}=2\pi n_{YAG}/\lambda_0$ is the wavevector in YAG. Results are shown for s- and p-polarizations, respectively.
Figure 6B:
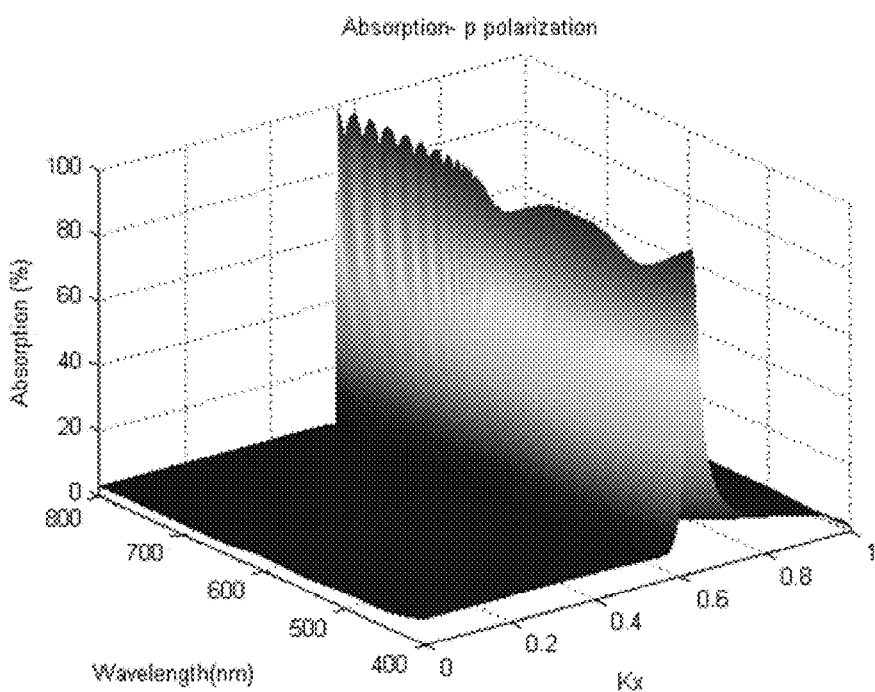

FIGS. 5A and 5B show calculations of the reflectivity at the YAG-metal interface as a function of relative transverse wave-vector $K_x=k_x/k_{YAG}$. The calculations employ measured Ag complex refractive indices. The results clearly show a sharp dip in reflectivity for $K_x\approx0.6$ for p-polarization, as expected for SPP excitation. The corresponding angle of incidence in the YAG is $\theta_{SPP}=37°$, from Equation (1). This just exceeds the critical angle of θ=33.3° for total internal reflection at a YAG air-interface, corresponding to the expected evanescent mode in air. The problem with SPP excitation is shown in FIGS. 6A and 6B which show the absorption of the incident light. Here, the SPP exciting p-polarization shows nearly 100% absorption at the SPP excitation wave vector. While only occurring at a small range of angles, this will clearly impact overall reflectivity if used as a recycling mirror for an adjacent luminescent source. Furthermore, near-field excitation and surface roughness will create multiple spatial frequencies, so losses would be expected in real systems over a much larger range of incident angles or $k_x$ values.

Figure 7A:
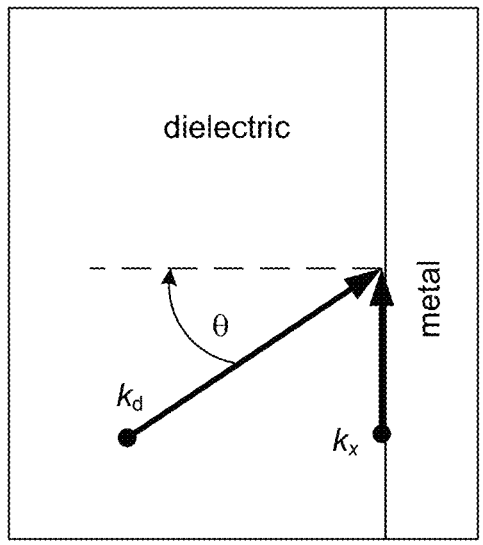
FIGS. 7A and 7B are illustrations of a metal-coated ceramic in which SPPs may form.
Figure 7B:
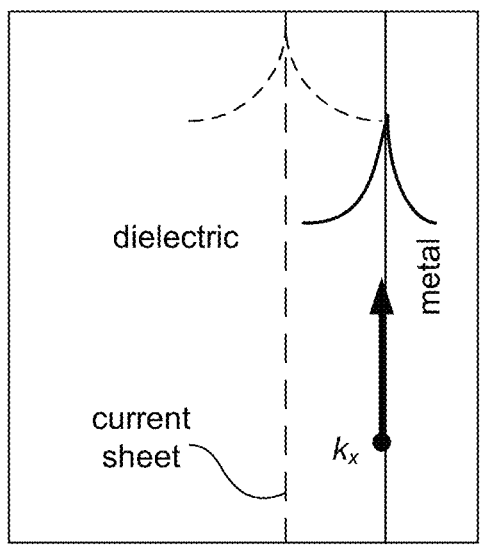

In the reflective geometry for metal coated ceramics, the metal layer would be considerably thicker than shown in FIG. 4 so that all the light is either reflected or absorbed; no transmission occurs. This geometry is shown in FIGS. 7A and 7B where the ceramic now forms the interface with the metal in which the SPPs may form. In FIG. 7A, there is illustrated standard excitation with a propagating plane wave and in FIG. 7B there is illustrated near-field excitation from a sinusoidal current sheet 100 nm from metal-ceramic interface.

For a transparent dielectric bounding the metal layer, no SPP excitation would occur with excitation for any propagating light field, that is for $K_x<1$ (assuming a lossless metal which would have $\Gamma=0$ in Equation (2)). However, scattering, surface roughness, and luminescent emission close to the reflective surface all produce evanescent excitation that implies relative transverse wavevector components $K_x$ at the ceramic/reflective-metal interface will exceed one. Therefore, SPP modes still can be excited for a thick metal reflector, introducing additional loss that will degrade the efficiency of high-reflectivity metalized coatings for ceramic conversion.

Figure 8A:
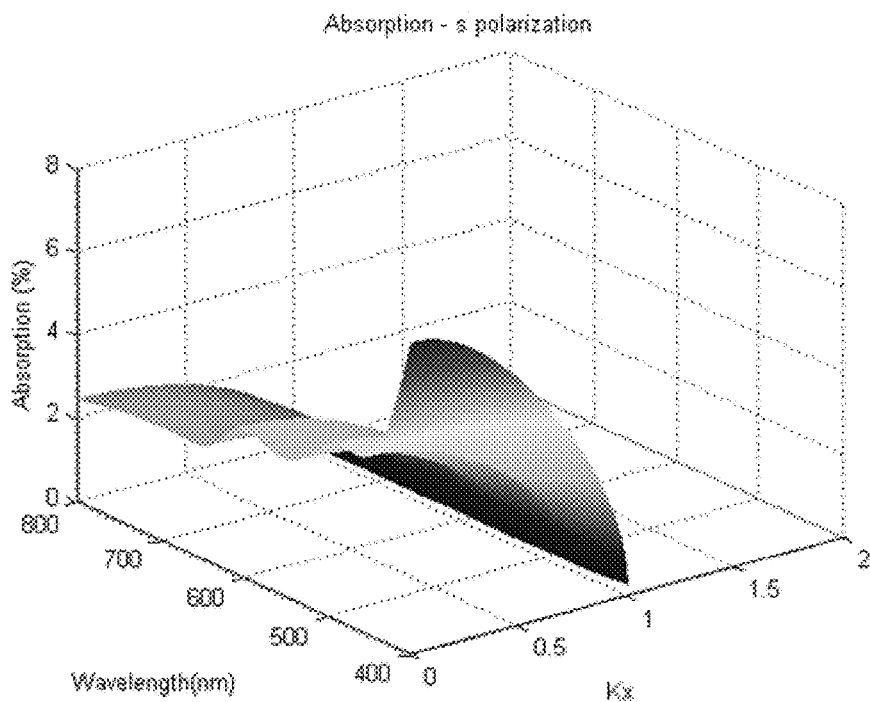
FIGS. 8A and 8B are 3D plots showing calculated absorption for propagating incident light for a 250 nm thick silver film in the configuration shown in FIG. 7A as a function of relative incident transverse wavevector $K_x=k_x/k_{ph}$, where the wavevector $k_{ph}=2\pi n_{YAG}/\lambda_0$ is the wavevector in YAG. Results are shown for s- and p-polarizations, respectively.
Figure 8B:
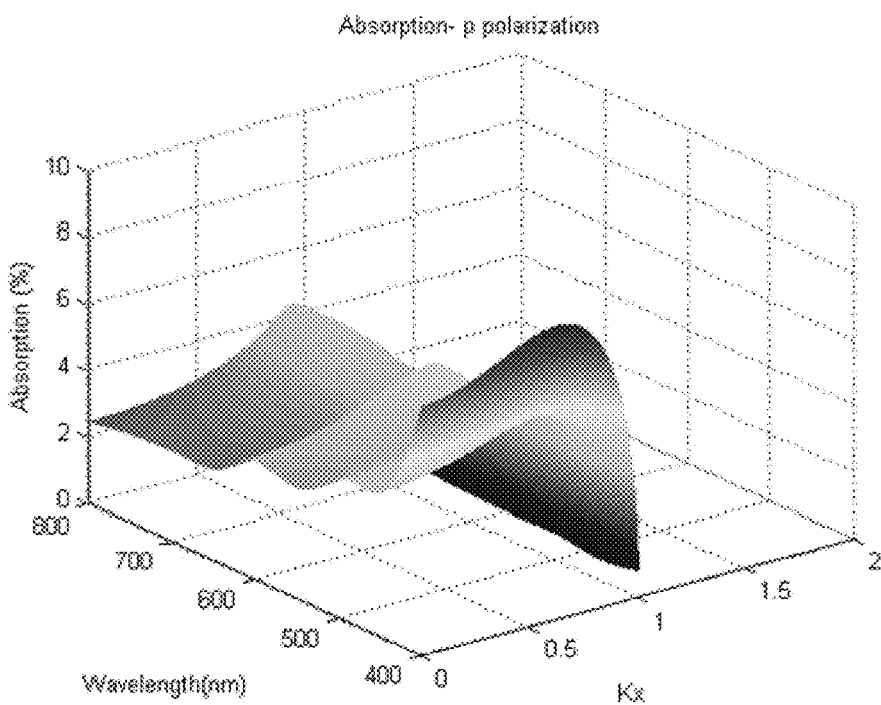
Figure 8C:
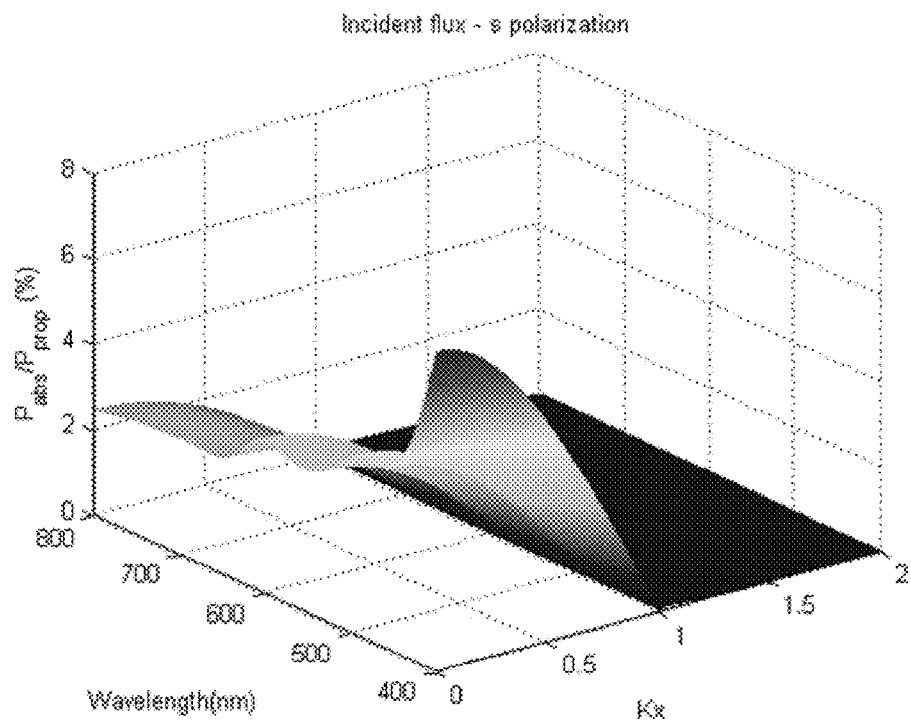
FIGS. 8C and 8D are 3D plots showing calculated absorbed power fraction $P_{abs}/P_{inc-prop}$ for propagating incident light for a 250 nm thick silver film for current sheet excitation in the configuration shown in FIG. 7B as a function of relative incident transverse wavevector $K_x=k_x/k_{ph}$, where the wavevector $k_{ph}=2\pi n_{YAG}/\lambda_0$ is the wavevector in YAG. Results are shown for s- and p-polarizations, respectively.
Figure 8D:
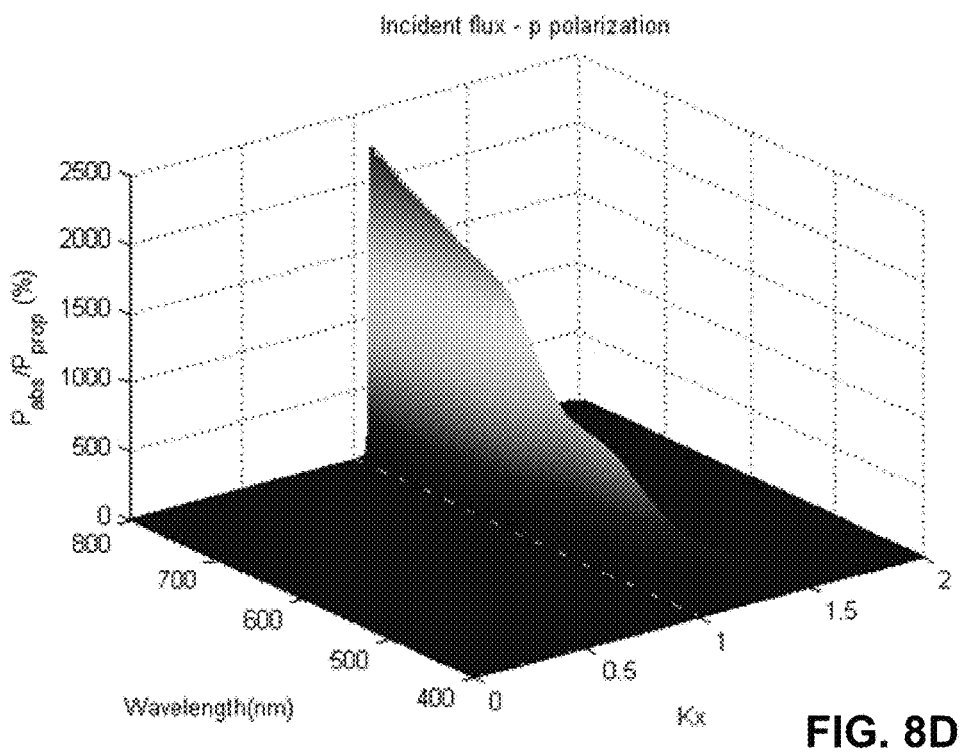

FIGS. 8A and 8B show the absorption for the simple Ag mirror (250 nm thick) on top of a ceramic (as in FIG. 7A) as a function of the angle of propagating incident light (in terms of $K_x$) for s- and p-polarizations. Here, as expected, ordinary propagating light does not excite SPP modes, as observed by the low and broad absorption dependence on $K_x<1$. FIGS. 8C and 8D are 3D plots showing calculated absorbed power fraction $P_{abs}/P_{inc-prop}$ for propagating incident light for the 250 nm thick silver film for current sheet excitation in FIG. 7B as a function of relative incident transverse wavevector $K_x=k_x/k_{ph}$, where the wavevector $k_{ph}=2\pi n_{YAG}/\lambda_0$ is the wavevector in YAG. Results are shown for s- and p-polarizations. The current sheet is 100 nm from the Ag surface. Because propagating modes do not exist in the dielectric for $K_x>1$, the results in FIGS. 8C and 8D show the ratio of the total power absorbed by the Ag, $P_{abs}$, to the incident power one would have from the current source when $K_x<1$, $P_{inc-prop}$, i.e., the power from free-space modes in the dielectric. The current source is assumed to have a fixed RMS current, so it can actually generate any amount of power, depending on the impedance of the boundaries. In this case, one can see for p-polarization in the evanescent region ($K_x>1$), the absorbed power is actually more than 10 times the propagating power that would be generated from the same current source. Therefore, this example shows how highly absorbing SPP modes can be excited from evanescent waves.

The present invention mitigates the lossy SPP mode excitation from scattering centers in the ceramic, luminescent centers that lie within sub-wavelength distances of the reflective interface, and from surface roughness in the case of unpolished or under-polished samples. Furthermore, the invention defines the appropriate parameter space for which small to moderate losses from such reflective surfaces can be reduced by taking advantage of backscattering in the ceramic. Therefore, one can fabricate high-reflectivity metal mirror structures on ceramics for high efficiency light recycling. Because the metalized coatings can then be soldered, sintered, or glued using any number of known techniques that provide high thermal conductivity, without regard to the optical properties of such bonds, the invention can achieve higher power radiance in luminescent conversion applications such as LARP as compared to previous solutions.

Figure 9:
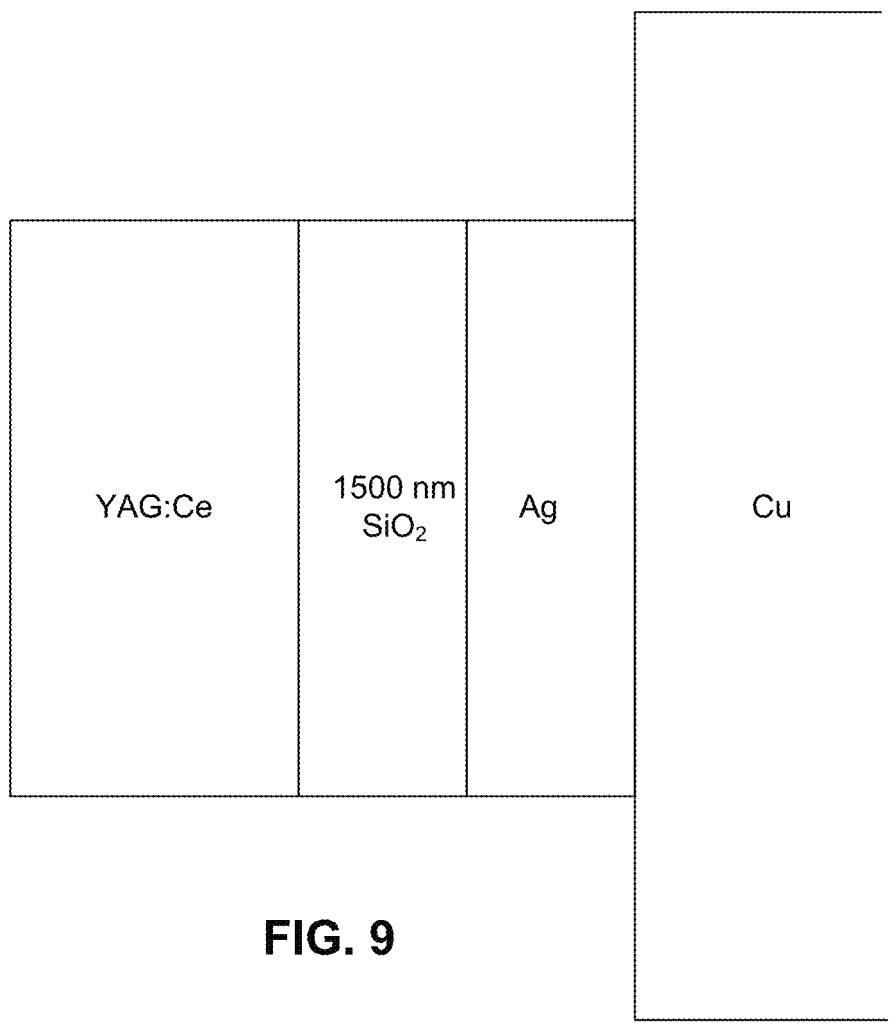
FIG. 9 is an illustration of an embodiment of the invention.

In one embodiment of the invention, a dielectric buffer layer is placed between the surface of a ceramic wavelength converter and a reflective metal coating that is optically thick. The refractive index of the buffer layer is preferably lower than the refractive index of the ceramic converter. The reflective metal coating is preferably either silver or aluminum. The dielectric buffer layer must be optically non-absorbing over the desired wavelength range. To minimize the impact on recycling of secondary emission directed towards the mirror surface and the remaining unabsorbed primary emission, buffer layer losses should be less than 1% at both wavelengths. Typical low index dielectrics will have losses much lower than this value. On the other side of the metal coating, solder metallization layers may be applied. FIG. 9 shows one example of the embodiment in which an $SiO_2$ layer is applied to the ceramic surface. A reflective Ag coating (500 nm thick) is then applied to the $SiO_2$ layer which has a thickness of 1.5 µm. The other side of the Ag coating is bonded to a 0.5 mm (approximately) thick Cu substrate by a number of well-known methods, including low-temperature Ag-sintering and die-bonding with Ag-epoxy. The $SiO_2$ layer has three functions: (a) by separating the reflective metal layer from the ceramic, evanescent waves generated close to the ceramic-$SiO_2$ interface will decay before reaching the metal layer, thereby minimizing SPP excitation and the associated losses; (b) the lower refractive index of the buffer implies that large angle propagating modes will also not penetrate the buffer layer, thereby providing lossless reflection at those incident angles exceeding the critical angle of the ceramic-buffer layer interface; and (c) the thickness of the $SiO_2$ smoothes some of the surface roughness of the unpolished ceramic surface so that the Ag surface is not as rough as the ceramic surface. This helps reduce SPP generation by the Ag surface roughness. The relative thinness of the $SiO_2$ layer provides excellent heat conductivity to a heatsink, minimizing thermal quenching of the phosphor comprising the ceramic converter.

Figure 10A:
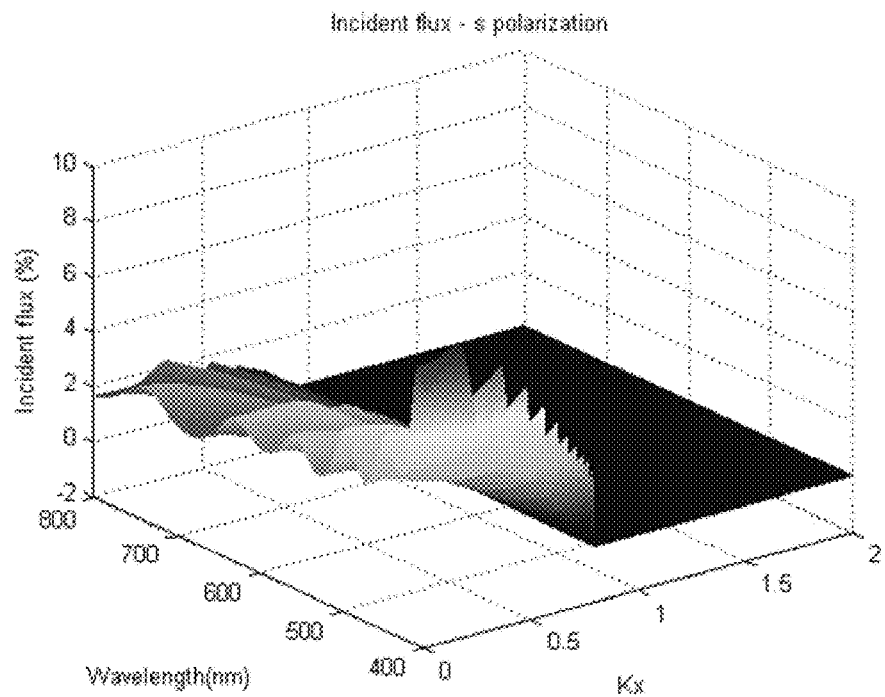
FIGS. 10A and 10B are 3D plots showing calculated absorbed power fraction $P_{abs}/P_{inc-prop}$ for current sheet excitation in FIG. 9 at YAG:Ce ceramic/$SiO_2$ interface as a function of relative incident transverse wavevector $K_x=k_x/k_{ph}$, where the wavevector $k_{ph}=2\pi n_{YAG}/\lambda_0$ is the wavevector in YAG. Results are shown for s- and p-polarizations, respectively.
Figure 10B:
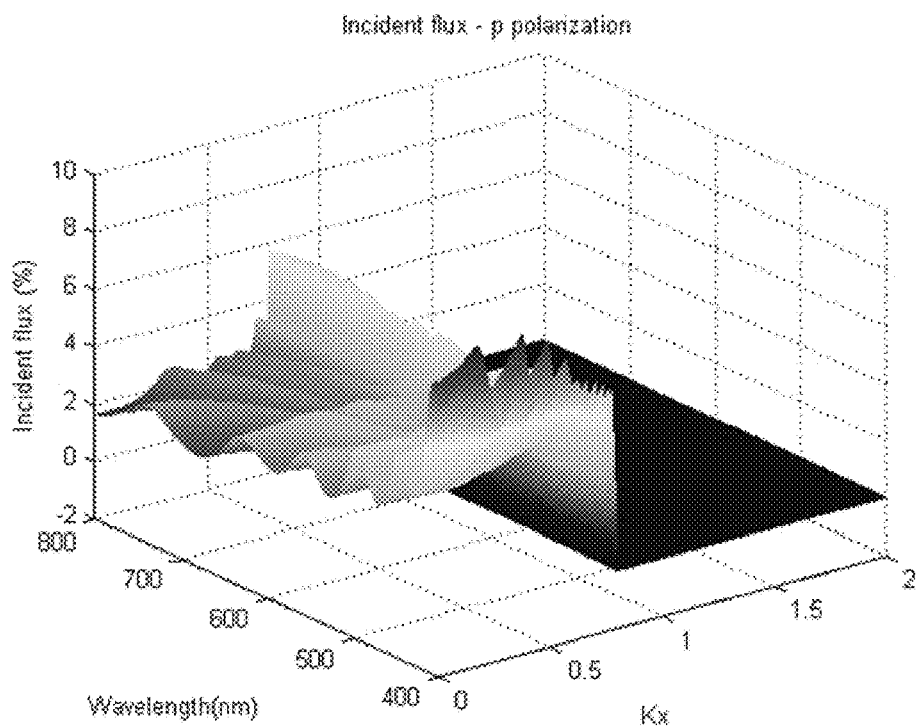

FIGS. 10A and 10B show absorption from a near-field current source to again simulate the effect of evanescent wave generation at the ceramic surface on the Ag reflector side. In particular, FIGS. 10A and 10B are 3D plots that show the calculated absorbed power fraction $P_{abs}/P_{inc-prop}$ for current sheet excitation in FIG. 9 at the ceramic/$SiO_2$ interface as a function of relative incident transverse wavevector $K_x=k_x/k_{ph}$, where the wavevector $k_{ph}=2\pi n_{YAG}/\lambda_0$ is the wavevector in YAG:Ce. Note that the axis in the Figures labeled "incident flux" is the net incident flux on the reflecting surface and is exactly the absorbed power fraction. Results are shown for s- and p-polarizations. One can see that the buffer layer almost completely quenches SPP excitation for evanescent waves generated in the ceramic when comparing to the results for Ag directly on YAG:Ce with an effective evanescent excitation 100 nm from the Ag mirror (FIGS. 7B and 8C-D.) Some remnants of the SPP excitation can be seen close to $K_x=1$ (p-polarization) due to the non-ideal SPP behavior of real lossy metals. The results show that incident transverse wavevectors $K_x>0.82$ ($\theta_{inc}>55.2°$) have no absorption, because the $K_x$ exceeds the corresponding critical angle for TIR from the YAG:Ce—

SiO$_2$ interface. (The ripple structure is from interference fringes generated caused by reflections at the interfaces in FIG. 9.)

Figure 11:
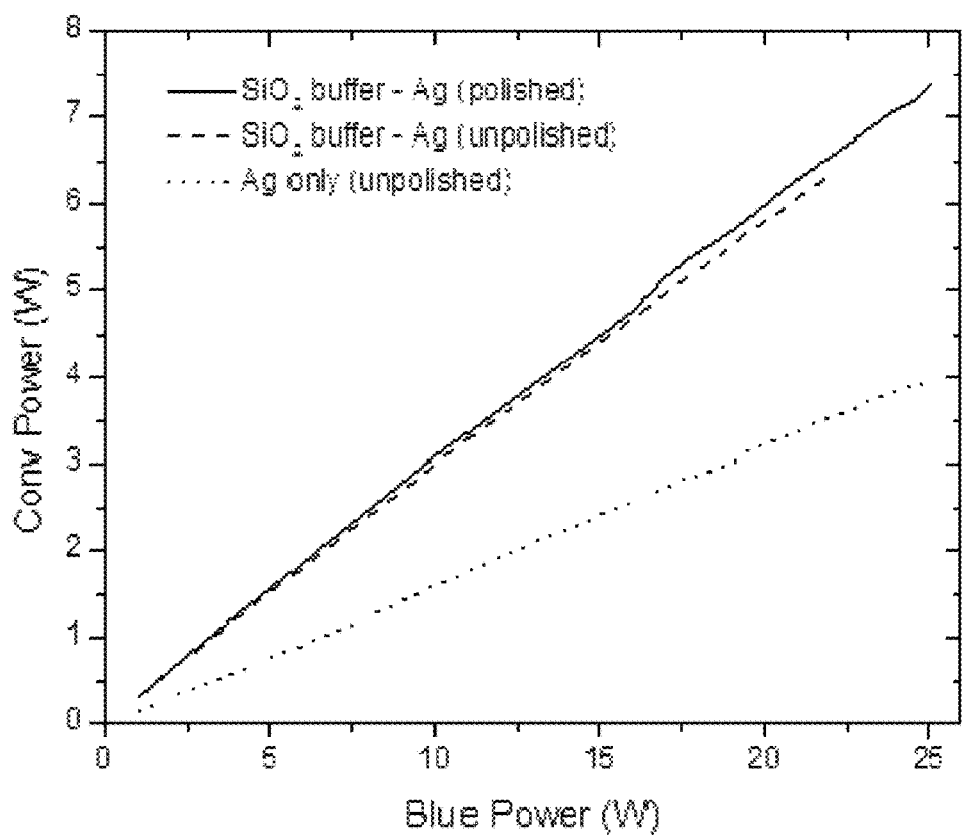
FIG. 11 is a plot of converted power measurements of the first (dashed) and a second embodiment (solid) of the invention compared to a direct Ag coating (dotted).

FIG. 11 shows the performance of an embodiment of the invention under excitation in a LARP setup similar to the one shown in FIG. 1 for YAG:Ce ceramic phosphors. Blue laser light at 445 nm is collimated with the TIR optic to provide an incident spot of approximately 2 mm$^2$ with a maximum total power of 25 W. The converted light is again collected by the TIR optic and measured by a thermopile type power meter after passing through the dichroic beam splitter and collimating lenses. Samples on copper substrates were mounted to a large heatsink with thermal grease.

The data show the measured converted power by a Ag-only coated ceramic wavelength converter compared to samples with a 1.5 µm SiO$_2$ buffer layer and a 0.5 µm Ag layer. The Ag (0.5 µm) only sample also included a 100 nm thick SiO$_2$ protective layer on top of the Ag reflector. The samples with the buffer layer also included a 0.5 µm SiO$_2$ protective layer on top of the Ag layer followed by a 100 nm Au soldering layer. Both samples were 1.85 mm×1.85 mm×0.10 mm thick with a 2.0% Ce concentration. These samples had relatively high scattering, with a measured scattering length of approximately 14 µm. For the first embodiment described, we consider the unpolished sample with an SiO$_2$ buffer layer compared to the sample with Ag-only. The buffer layer sample was attached directly to the large heatsink with thermal grease. The buffer layer sample shows nearly a factor of two improvement in conversion efficiency over the Ag-only sample. Note that the data for the (unpolished) buffer layer sample do not extend to the full 25 W pump because thermal quenching prevented any increase in converted power above that point. This was mostly likely caused by the use of thermal grease to attach this particular sample, rather than a proper bonding method.

In general, for this first embodiment, the buffer layer can be any lower refractive index dielectric material that has negligible loss in the desired optical regime and should be at least roughly one wavelength thick at the dominant emission wavelength. Preferably, the refractive index should be at least 10 to 20% lower than the refractive index of the ceramic converter so that total internal reflection (TIR) will aid reflectivity. By making the refractive index of the buffer layer as low as possible, the transverse wavevector $k_x$ that can propagate to the metal layer will be as small as possible, reducing the possibility of SPP excitation. Thicker buffer layers are also desirable to smooth surface roughness features present on the ceramic surface, thereby reducing SPP excitation on the metal layer. Maximum thickness is limited by deposition techniques and thermal resistance requirements of the layer. For evaporated SiO$_2$ deposition, thicknesses less than 10 µm are desirable for best thermal conductance; thin film deposition techniques of SiO$_2$ may place more stringent upper limits, such as 1.5 µm, to prevent cracking of the coating.

In general, for high luminance or radiance applications, one can estimate the maximum buffer layer thickness $l_b$ for an arbitrary buffer material of thermal conductivity κ by the following formula:

$$l_b < \frac{\kappa \Delta T}{\eta_c E}. \qquad (4)$$

Here, $\Delta T$ is the temperature difference across the buffer layer which represents the difference between the heatsink temperature and the maximum usable temperature of the ceramic converter before temperature quenching. The incident pump power per unit area is given by E (W/m$^2$), and $\eta_c$ is the phosphor conversion efficiency (Stokes shift and other non-radiative losses). For SiO$_2$ (κ=1.3 W/m/K) and most common ceramic phosphors such as YAG:Ce, one can obtain a more numerical result Assuming a heatsink temperature of 50° C. at maximum operating powers, $\Delta T$=100° C. is a good practical limit to avoid thermal quenching. Additionally, emission at a dominant yellow wavelength (YAG:Ce), $\eta_c$=0.6 is a reasonable value. Thus the thickness of the buffer layer is limited by, $$l_b < \frac{200 \text{ W/m}}{E}. \qquad (5)$$

For example, at typical LARP pump intensities of 20 W/mm$^2$, the thickness $l_b$ is less than 10 µm. Considerably thinner thicknesses are highly desirable to further minimize thermal quenching effects which can arise from strong temperature gradients within even the high thermal conductivity ceramics, limiting $l_b$ to well below 5 µm in such applications.

The lower limit on buffer layer thickness is determined by ability to limit evanescent wave propagation into the metal reflector layer. Typically, the thickness $l_b$>200 nm for visible wavelengths in silica. In general, if the index for the ceramic converter is $n_c$. the index for the buffer layer is $n_b$, and $K_x$ is the relative transverse wavevector in the ceramic converter, then the attenuation A of the evanescent wave in the buffer layer is given by, $$A = \exp\left[-\left(\frac{2\pi n_c}{\lambda_0}\right)\sqrt{K_x^2 - \left(\frac{n_b}{n_1}\right)^2}\, \ell\right]. \qquad (6)$$

Taking an attenuation of $A=e^{-3}$ to strongly attenuate evanescent waves in the buffer layer, we obtain the lower bound on $l_b$ specifically for a SiO$_2$ buffer layer on YAG ceramic:

$$l_b > \frac{3}{\left(\frac{2\pi n_c}{\lambda_0}\right)\sqrt{K_x^2 - \left(\frac{n_b}{n_c}\right)^2}} = \frac{0.27\lambda_b}{\sqrt{K_x^2 - 0.69}}, \qquad (7)$$

Note that close to the critical angle ($K_x=n_b/n_c$), the required attenuation length diverges, but this will not limit the effectiveness of the buffer layer as incident waves are in a distribution of $K_x$. For values of $K_x \approx 1$, $l_b > 0.5\lambda_0$; For a typical free-space wavelength of 550 nm, $l_b$>225 nm.

In the visible range, reflective metal layers are generally limited to Ag, Al, or combinations of both, either as an alloy or as separate adjacent layers. Aluminum is generally desirable for high reflectivity in the blue and ultraviolet regions of the electromagnetic spectrum because of aluminum's higher intrinsic plasma frequency; it also has excellent IR reflectance. However its reflectance is lower than silver throughout most of the visible range. For the red part of the visible range or IR, gold is also a viable reflective metal.

Ceramic converters may comprise any known phosphor capable of being sintered to form a solid, luminescent, polycrystalline ceramic.

In a second embodiment, the surface of the ceramic to which the coatings are applied is polished. As shown discussed above, even small amounts of surface roughness decrease reflectance of reflective metal surfaces. At an incident wavelength of 450 nm, a root-mean-square (rms) surface roughness of less than 10 nm is required for Al and much less than 1 nm for Ag if close to ideal reflectivities are to be achieved. (Here surface roughness is the standard deviation of the surface height.) However, if the correlation distance is much larger than the surface roughness, i.e., the slope of the surface is much less than one, then the probability of exciting SPP modes and reducing reflectance is much reduced. Thus, when ceramic surfaces are polished to less than these criteria and a buffer layer is used, the actual surface over which the metallization layer is applied may still be able to meet the needed smoothness for minimal plasmon losses.

In this regard, FIG. 11 also shows an example of the second embodiment in which the ceramic converter surface (2.0% YAG:Ce, 100 μm thick) was polished using ordinary techniques. In this case, the ceramic surface roughness is still expected to be many tens of nanometers, considerably above the expected surface roughness requirements for minimal SPP loss. The coated ceramic converter was bonded to a Cu substrate with standard low-temperature Ag-sintering techniques. The same buffer layer coating was applied as in the first embodiment. In this case, efficiency is slightly higher than for the unpolished sample, and application of the full laser power (25 W) does not cause roll-over. It is believed the metal-to-metal substrate bonding in this case contributed to the better high-power results, but the small efficiency improvement was likely from polishing. Note that for both polished and unpolished samples with buffer layers, the strong backscattering from the ceramic also lessens the effect of losses at the reflective layers by diffusely reflecting back-emitted radiation before it reaches the lossy metal surface.

Figures 12A, 12B:
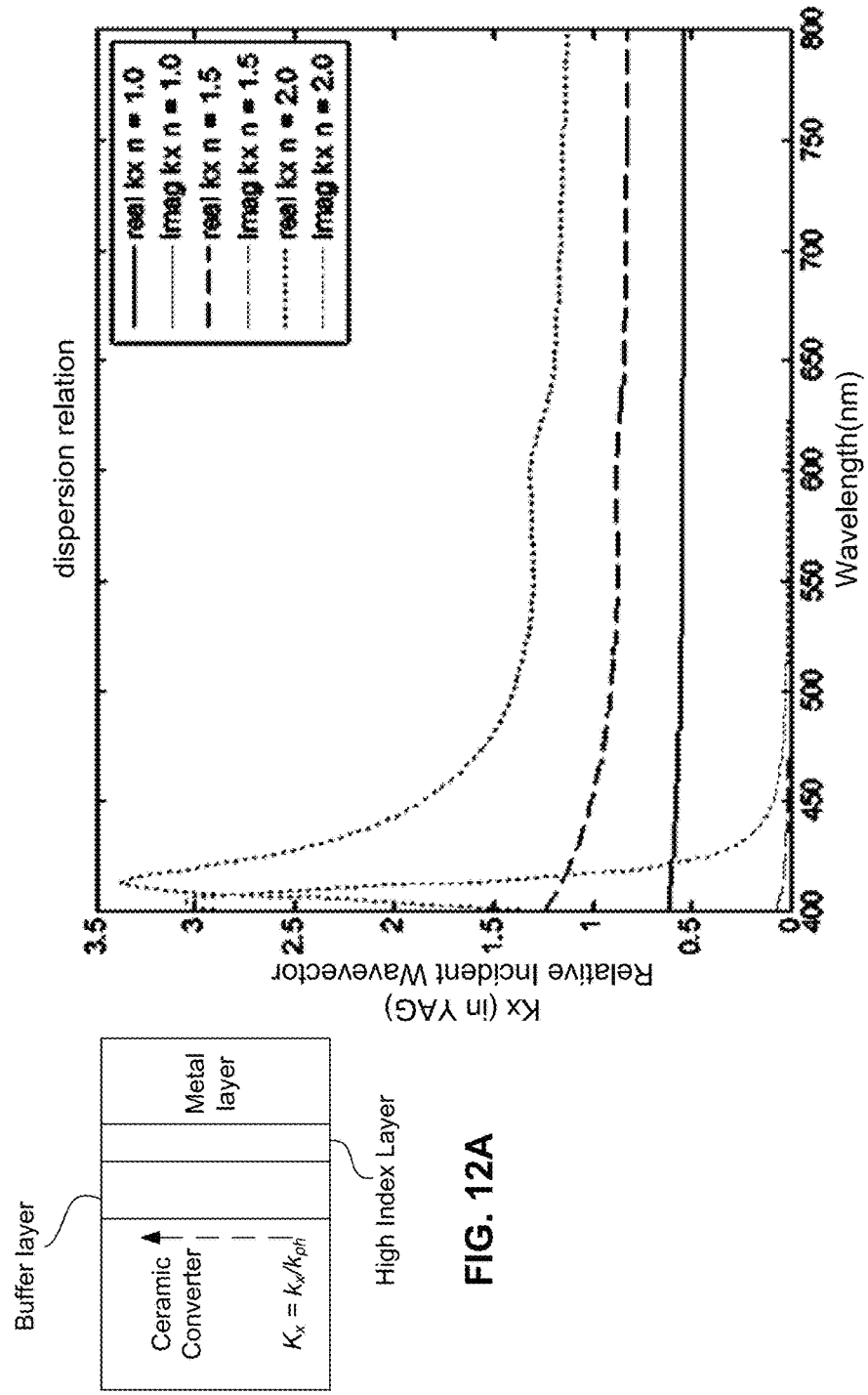
FIGS. 12A and 12B are an illustration of a third embodiment and a plot showing calculated SPP dispersion relation for relative wavevector $K_x = k_x/k_{ph}$ versus free-space wavelength for geometry shown in FIG. 12 A, respectively.

In a third embodiment shown in FIG. 12A, an additional high-refractive-index layer is included between the low-refractive-index buffer layer and the metal layer. The high-refractive-index layer serves to move the SPP modes to higher transverse wavevector values $k_x$, thereby making it less probable for a given set of evanescent modes and surface roughness conditions to excite SPP modes. This can be seen in FIG. 12B which shows plots of the SPP dispersion relation for media with different refractive indices bounding the metal layer and excited by incoming radiation with relative transverse wavevector values K. As before, $K_x$ represents the relative transverse wavevector in the ceramic converter (YAG:Ce in this example). Incident light in material with wavevector $k_{ph}$ and transverse component $k_x$ propagates to metal layer through buffer layer and high index layer with index n. Dispersion relations calculated for n=1.0 (solid), 1.5 (dashed), and 2.0 (dotted). Real component of $K_x$ is relevant for SPP excitation. It is clear that increasing the refractive index of the adjacent dielectric layer increases the required $K_x$ values for SSP excitation, especially in the blue region.

Figure 15A:
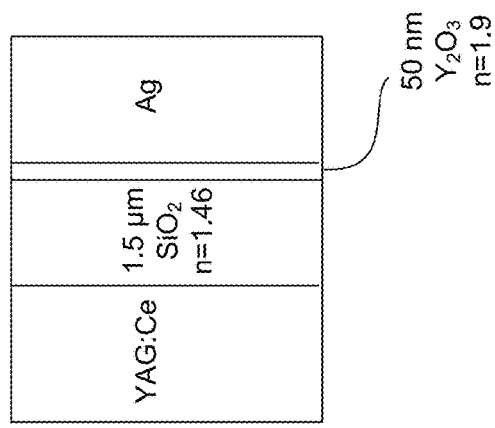
FIGS. 15A and 15B are an illustration of a configuration having a 1.5 μm $SiO_2$ buffer layer and a 50 nm $Y_2O_3$ quenching layer and a plot showing calculated reflectance for incident light from YAG:Ce converter at 10° and 45° with respect to normal, respectively.
Figure 15B:
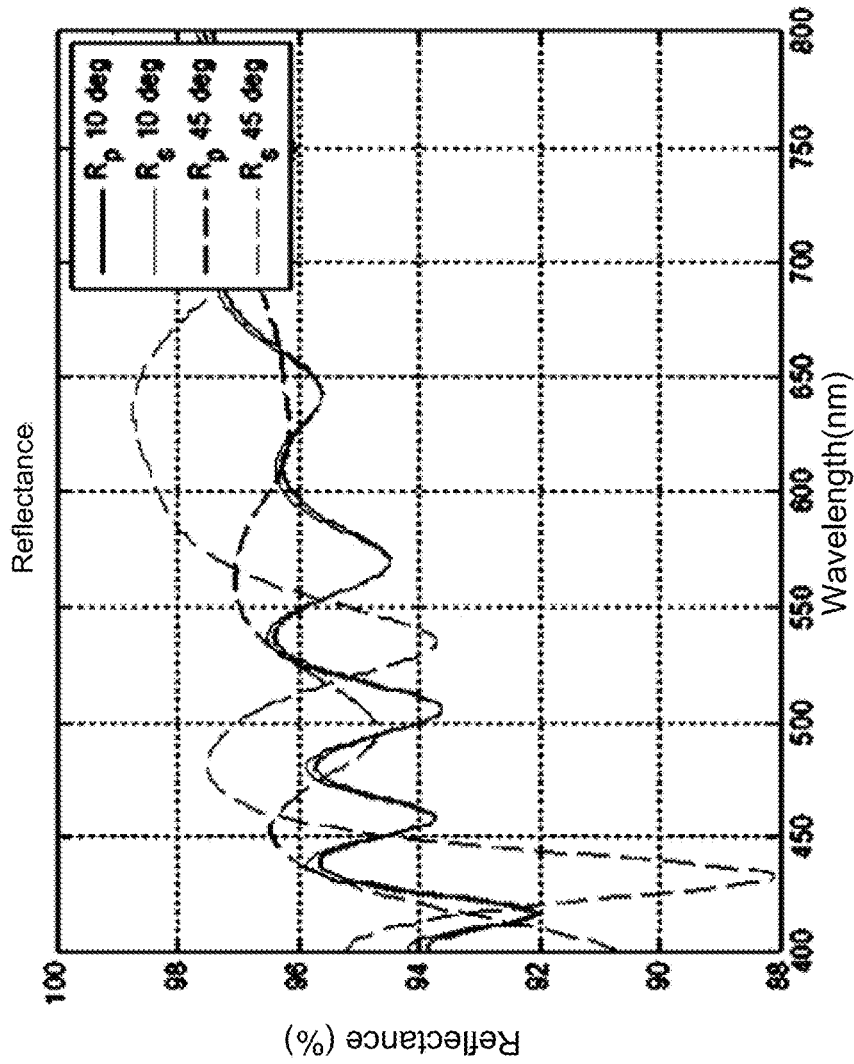
Figure 16A:
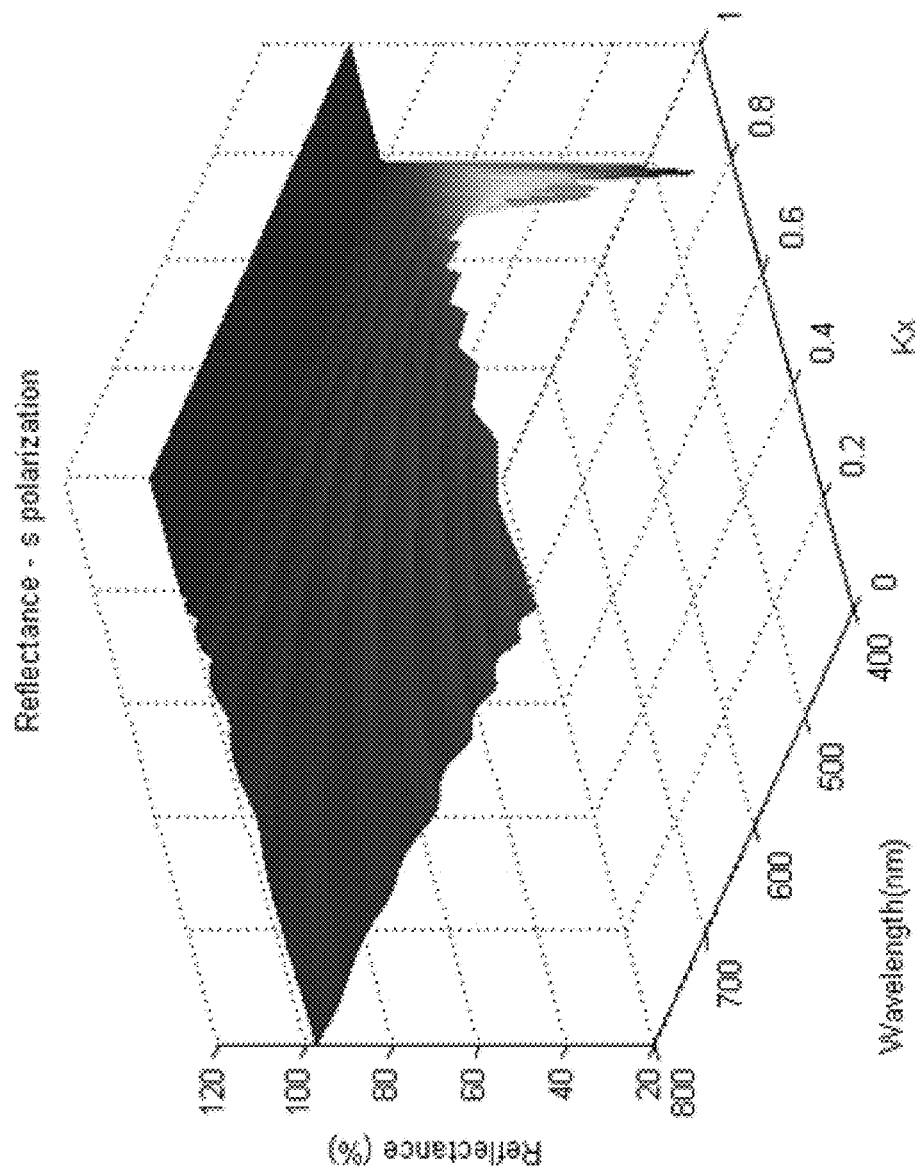
FIGS. 16A and 16B are 3D plots showing reflectivity as a function of relative incident transverse wavevector $K_x = k_x/k_{ph}$ and wavelength, where the wavevector $k_{ph} = 2\pi n_{YAG}/\lambda_0$ is the wavevector in YAG. Results are shown for s- and p-polarizations, respectively.
Figure 16B:
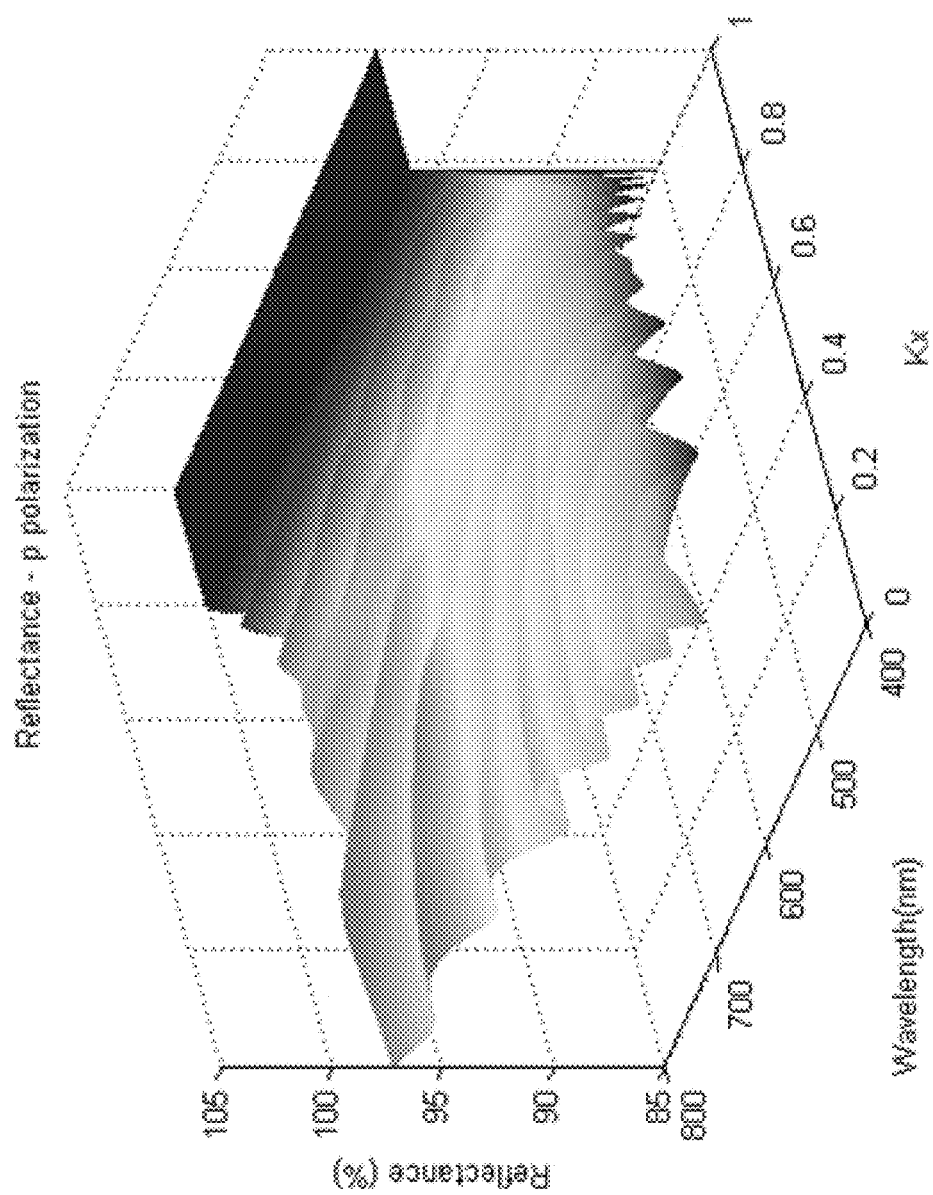

As a particular example, the effect of including an SPP quenching layer of high-index $Y_2O_3$ (n=1.9) on Ag is demonstrated in FIGS. 13A-B. For the sake of illustration, results are simulated for the case of thin $SiO_2$ buffer layer to show the effect of evanescent excitation by a hypothetical current source at the YAG:Ce—$SiO_2$ boundary (FIG. 13A). FIG. 13B shows the absorption (net incident flux into the Ag layer) from SPP excitation for a 250 nm $SiO_2$ buffer layer without a quenching layer (p-polarization). SPP excitation appears at a low value of $K_x \approx 0.6$. FIG. 14A shows the same geometry, but with an additional 100 nm $Y_2O_3$ quenching layer, keeping the overall optical path length the same as in FIG. 13A. As in FIGS. 13A and 13B, a hypothetical current source is used to excite both radiative ($K_x<1$) and evanescent ($K_x>1$) waves. As shown in FIG. 14B, the SPP excitation is reduced in the visible range, and the relative wavevector for excitation has a higher value of $K_x \approx 1.3$-1.4. A more optimized geometry is shown in FIG. 15A with a thicker buffer layer and a thinner quenching layer. FIG. 15B shows sample reflectances at 10° and 45°. The full range of reflectances are shown in FIGS. 16A and 16B. Note again the large angle TIR that occurs at the ceramic-$SiO_2$ interface.

In general, the SPP quenching layer must have a refractive index higher than the buffer layer, with desirable values of n≥1.8. Materials for the quenching layer include, but are not limited to, high refractive index, very low optical absorption dielectrics such as $Y_2O_3$, $HfO_2$, $ZrO_2$, $Nb_2O_5$, and $TiO_2$ (rutile phase). The thickness and material of the quenching layer may depend on actual desired regions of highest reflectance and other material considerations such as adhesion. For example, one can adjust the thickness of the quenching layer such that the net phase shift caused by the reflection from the Ag reflector plus that for light traversing both directions in the quenching layer is 180°. This means a reflection from light reflecting off of the Ag reflector will be completely in phase (360°) with light reflected off of the quenching layer-buffer layer interface which also would experience a 180° phase shift. This is equivalent to adding a single layer quarter-wave stack to enhance reflection at a particular wavelength range. Mathematically, if the phase shift of the reflected wave off the metal reflector-quenching layer interface is denoted by $\phi_M$, then the condition for maximum reflection is, $$\phi_M + \frac{4\pi n_q \ell_q}{\lambda_0} = \left(m + \frac{1}{2}\right)\pi. \tag{8}$$

Figure 17:
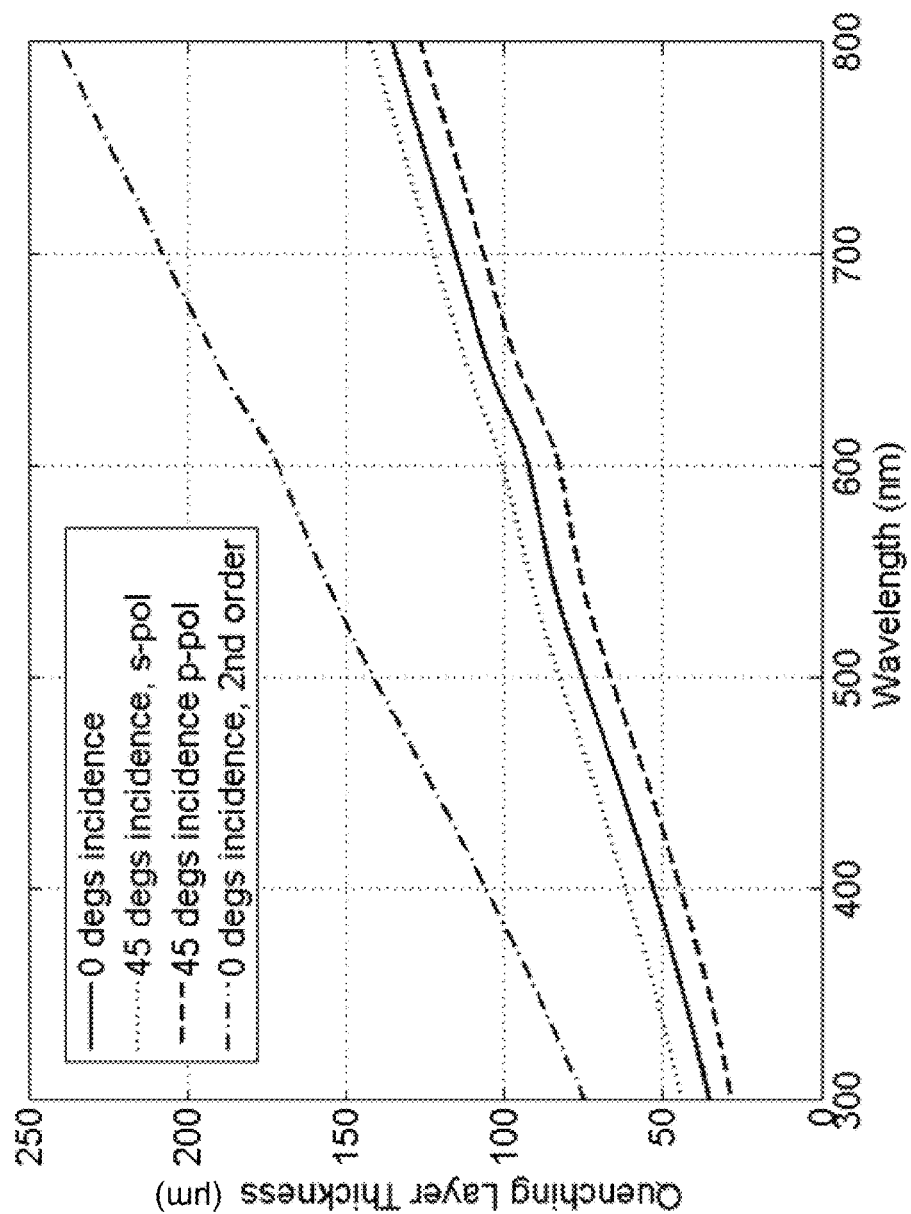
FIG. 17 is a plot of the thickness of the quenching layer, $l_q$, chosen to satisfy m=0 and m=1 versus wavelength for Equation 8.
Figure 20B:
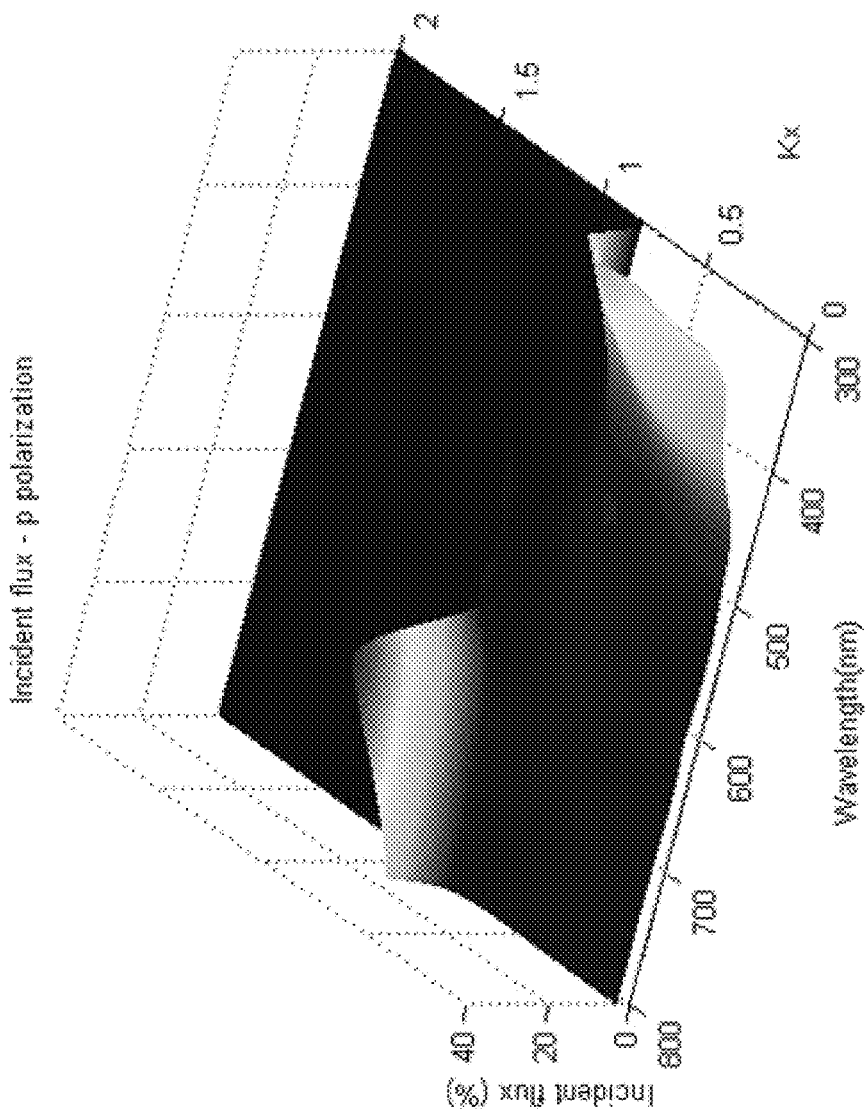
FIGS. 20A and 20B illustrate the absorbed flux using a 25 nm quenching layer configuration.
Figure 20A:
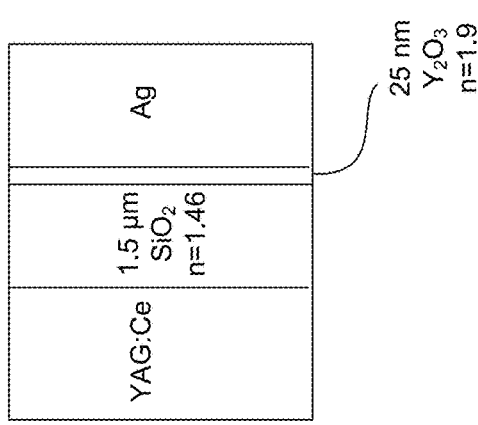

Here, $l_q$ is the thickness of the quenching layer, $n_q$ is the refractive index of the quenching layer, and m is an integer. A plot of the length $l_q$ chosen to satisfy m=0 and m=1 versus wavelength is shown in FIG. 17. FIGS. 18A and 18B show the propagating reflectances for the case of m=0 at $\lambda_0$=650 nm. The high-index SPP quenching layer has a thickness adjusted for normal incidence enhancement at 650 nm. The optical path in $Y_2O_3$ adjusted for 180° round-trip phase shift. One can observe a broad maximum in near normal incidence (10°) around 650 nm. Note that in FIGS. 15A and 15B the 10° angle of incidence reflectance in the same region for the 50 nm thick $Y_2O_3$ SPP quenching layer is less than in FIG. 18B.

For the quenching layer to be effective, its thickness must be at least large enough to confine the SPP evanescent wave within the quenching layer; otherwise the SPP evanescent wave will have large amplitudes in the lower refractive index buffer layer, thereby losing the benefit of the quenching layer. The criteria for confining SPP modes within the quenching layer are similar to the buffer layer lower limits. If we require at a minimum that the amplitude of the SPP evanescent wave drops to at least $e^{-1}$ before reaching the buffer layer, then the quenching layer thickness has the lower bound, $$\ell_q > \frac{1}{\left(\frac{2\pi n_c}{\lambda_0}\right)\sqrt{K_{x\text{-}SPP}^2 - \left(\frac{n_q}{n_c}\right)^2}} = \frac{0.09\lambda_0}{\sqrt{K_{x\text{-}SPP}^2 - 1.11}}, \quad (9)$$

where the second equality applies for a YAG converter and a $Y_2O_3$ quenching layer with index $n_q=1.9$. From the SPP dispersion relation shown in FIG. 12B for selected dielectric layer indices, we see if $n_q \approx n \approx 2$, then the minimum $K_{x\text{-}SPP}$ is on the order of 1.3-1.5 in the visible range. This gives an approximate numerical lower bound for $l_q > 0.08\lambda_0 - 0.12\lambda_0$. For $\lambda_0=550$ nm, this is in the range of 50 nm. In practice, one may even reduce the lower bound thickness in Equation (8) by an additional factor of two while still providing some quenching (increase in $K_{x\text{-}SPP}$) to meet other criteria such as desired propagating mode reflectivities. Simulations shown in FIGS. 19A-B and 20A-B show how the absorbed flux (analogous to FIGS. 14A and 14B) varies with 25 nm and 50 nm quenching layers. One can see, because of interference effects, SPP modes in the 450-600 nm range are suppressed even though analysis shows they have lower $K_{x\text{-}SPP}$ than 50 nm simulation.

The maximum thickness of the quenching layer is not highly constrained other than reasons for constraining the overall thickness of the coatings for lowest thermal resistance and optimal reflectance. Quenching layers may also be multiple layers, to provide additional functionality, increased reflectance, or both. This embodiment can be further aided by using a polished ceramic surface to further minimize SPP excitation through roughness in the metal layer.

Figure 21:
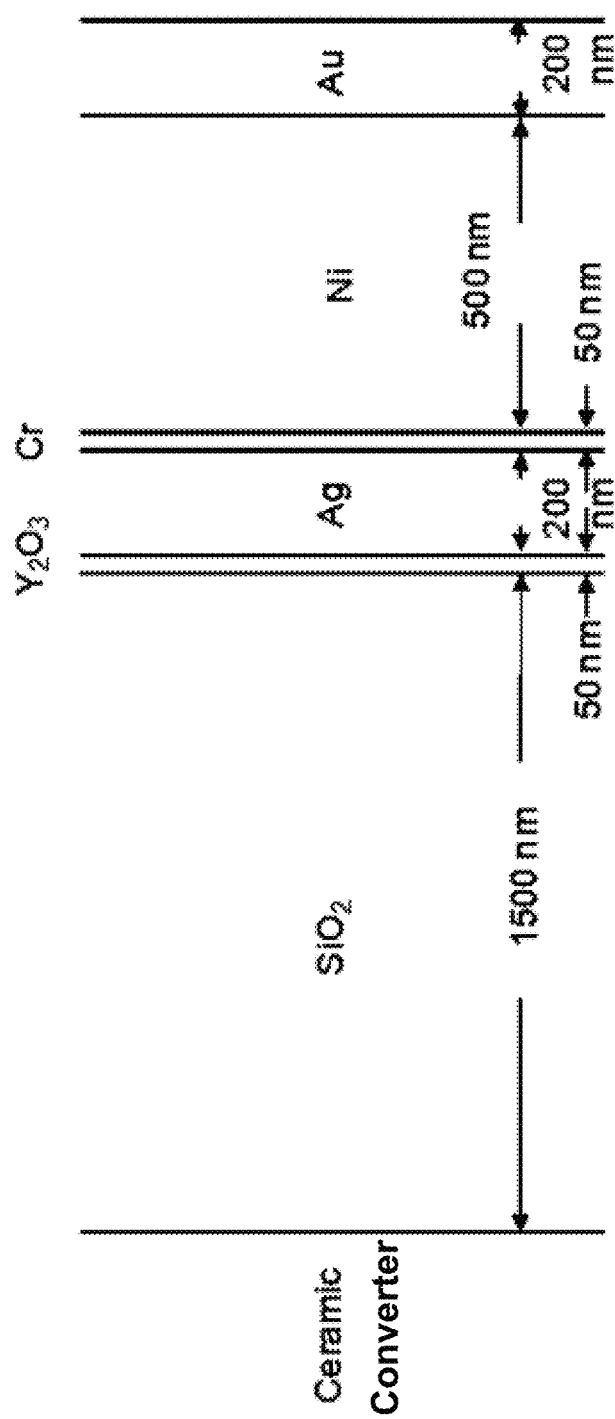
FIG. 21 is a further example of the second embodiment (FIG. 15A), including additional metallization layers to aid soldering or other metal bonding methods.

In a fourth embodiment, all the previous embodiments may include adjacent adhesion layers for the metal reflector. Adhesion layers include more reactive oxides such as $Y_2O_3$ or $TiO_2$ which can serve dual functions as both adhesion layer of Ag to oxide dielectrics and as an SPP quenching layer. Other adhesion layers include sub-nanometer thick metal nitrides. For example, one may further apply the $Y_2O_3$ layer of only a few nanometers to serve primarily as an adhesion layer, while a second layer is applied between the buffer layer and $Y_2O_3$ layer with a refractive index even higher than the $Y_2O_3$ adhesion layer to function as quenching layer. This may include materials such as $TiO_2$ (rutile phase) which has an index of refraction of greater than 2.3 in the visible. By keeping the $Y_2O_3$ layer very thin, the evanescent wave of the SPP modes interacts primarily with the even higher refractive index $TiO_2$ layer, further increasing the required transverse wavevector $K_x$ needed for SPP excitation. Additionally, adhesion layers may be included on the attachment side of the metal reflector. For Ag, this may include Al, Cr, and other more reactive metals. Additional metal layers may be added to aid soldering (or other metal bonding methods). These generally include diffusion limiting layers such as Ni and non-oxidizing soldering layers such as Au. These structures are well-suited for soldering to high thermal conductivity Cu substrates, possibly with additional Ni—Au or Ni—Ag layers to further aid bonding and minimize Cu diffusion into the solder or sintered-Ag region. Such a complete structure with a dual function adhesion layer-quenching layer is shown in FIG. 21.

Although the focus of the invention is on reflective LARP applications such as those shown in FIG. 1, the coating approach can also be used in other LARP applications, including transmissive whereby the reflector has openings for incident light and the reflector serves to back-reflect converted light in the desired forward direction. In addition to LARP applications, which include projection, automotive lighting, and general lighting, the invention could also be used for other high radiance, high thermal load light sources such as aperture lamps that use ceramic converters. For example, an aperture lamp could use such coatings on all sides of a ceramic wavelength converter block, except for a small aperture where high-radiance emission is desired and the LEDs are placed.

While there have been shown and described what are at present considered to be preferred embodiments of the invention, it will be apparent to those skilled in the art that various changes and modifications can be made herein without departing from the scope of the invention as defined by the appended claims.

What is claimed is:

1. A ceramic wavelength converter having a high reflectivity reflector, the ceramic wavelength converter being capable of converting a primary light into a secondary light, the reflector comprising a reflective metal layer and a dielectric buffer layer between the ceramic wavelength converter and the reflective metal layer, the buffer layer being non-absorbing and non-wavelength selective with respect to the secondary light and having an index of refraction that is less than an index of refraction of the ceramic wavelength converter, wherein the reflector has a quenching layer between the buffer layer and the reflective metal layer, the quenching layer having an index of refraction that is greater than the index of refraction of the buffer layer.

2. The ceramic wavelength converter of claim 1 wherein the reflectivity of the reflector is at least 80% with respect to the secondary light.

3. The ceramic wavelength converter of claim 1 wherein the reflectivity of the reflector is at least 85% with respect to the secondary light.

4. The ceramic wavelength converter of claim 1 wherein the reflectivity of the reflector is at least 95% with respect to the secondary light.

5. The ceramic wavelength converter of claim 1 where the converter comprises at least one phosphor selected from $(Y,Lu,Gd)_3Al_5O_{12}$:Ce and $(Ba,Ca,Sr)Si_2O_2N_2$:Eu.

6. The ceramic wavelength converter of claim 1 wherein the converter is in the form of a flat plate having a thickness greater than a scattering length of the secondary light in the converter.

7. The ceramic wavelength converter of claim 1 wherein the reflective metal layer is optically thick with respect to the secondary light.

8. The ceramic wavelength converter of claim 1 wherein the buffer layer has a thickness of at least one secondary light wavelength.

9. The ceramic wavelength converter of claim 1 wherein the refractive index of the buffer layer is at least 10% lower than the refractive index of the ceramic wavelength converter.

10. The ceramic wavelength converter of claim 1 wherein the refractive index of the buffer layer is at least 20% lower than the refractive index of the ceramic wavelength converter.

11. The ceramic wavelength converter of claim 1 wherein the ceramic wavelength converter is comprised of YAG:Ce and the buffer layer is $SiO_2$.

12. The ceramic wavelength converter of claim 11 wherein the buffer layer has a thickness of less than 200

W/m divided by an incident power of the primary light per unit area, E, expressed as W/m².

13. The ceramic wavelength converter of claim 1 wherein the buffer layer has a thickness of less than 10 µm.

14. The ceramic wavelength converter of claim 1 wherein the buffer layer has a thickness of less than 5 µm.

15. The ceramic wavelength converter of claim 11 wherein the buffer layer has a thickness, $l_b$, defined by $$\ell_b > \frac{-0.27\lambda_0}{\sqrt{K_x^2 - 0.69}}.$$

16. The ceramic wavelength converter of claim 1 wherein the quenching layer has an index of refraction greater than or equal to 1.8.

17. The ceramic wavelength converter of claim 1 wherein the quenching layer is comprised of a dielectric material selected from $Y_2O_3$, $HfO_2$, $ZrO_2$, $Nb_2O_5$, and $TiO_2$ (rutile phase).

18. The ceramic wavelength converter of claim 1 wherein the quenching layer has a thickness such that secondary light reflected by the reflective metal layer is in phase with secondary light reflected at an interface between the buffer layer and the quenching layer.

19. The ceramic wavelength converter of claim 1 wherein the buffer layer is comprised of $SiO_2$ and the quenching layer is comprised of $Y_2O_3$.

20. The ceramic wavelength converter of claim 19 wherein the ceramic wavelength converter is comprised of YAG:Ce.

21. The ceramic wavelength converter of claim 20 wherein the quenching layer has a thickness, $l_q$, defined by $$\ell_q > \frac{0.09\lambda_0}{\sqrt{K_{x\text{-}SPP}^2 - 1.11}}.$$

22. A ceramic wavelength converter having a high reflectivity reflector, the ceramic wavelength converter comprising a $(Y,Lu,Gd)_3Al_5O_{12}$:Ce phosphor, the reflector comprising a reflective silver metal layer and a dielectric $SiO_2$ buffer layer between the ceramic wavelength converter and the reflective silver metal layer, the buffer layer having a thickness of less than 10 µm, the phosphor configured to convert a primary light to a secondary light, the buffer layer non-wavelength selective with respect to the secondary light, wherein the reflector has a $Y_2O_3$ quenching layer between the buffer layer and the reflective silver metal layer.

23. The ceramic wavelength converter of claim 22 wherein the buffer layer has a thickness of less than 5 µm.

24. The ceramic wavelength converter of claim 22 wherein the quenching layer has a thickness of 50 nm.

* * * * *